United States Patent
Cheng et al.

(10) Patent No.: US 9,548,372 B2
(45) Date of Patent: Jan. 17, 2017

(54) SEMICONDUCTOR DEVICE WITH TUNABLE WORK FUNCTION

(71) Applicant: TAIWAN SEMICONDUCTOR MANUFACTURING CO., LTD., Hsinchu (TW)

(72) Inventors: Chung-Liang Cheng, Changhua (TW); Wei-Jen Chen, Taichung (TW); Yen-Yu Chen, Taichung (TW); Wei Zhang, Chupei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 101 days.

(21) Appl. No.: 14/609,138

(22) Filed: Jan. 29, 2015

(65) Prior Publication Data

US 2016/0225871 A1    Aug. 4, 2016

(51) Int. Cl.
*H01L 29/51* (2006.01)
*H01L 29/423* (2006.01)

(52) U.S. Cl.
CPC ......... *H01L 29/511* (2013.01); *H01L 29/4236* (2013.01)

(58) Field of Classification Search
None
See application file for complete search history.

(56) References Cited

U.S. PATENT DOCUMENTS

| | | | | |
|---|---|---|---|---|
| 9,202,884 | B2 * | 12/2015 | Niimi | H01L 21/28088 |
| 2009/0194797 | A1 * | 8/2009 | Shimizu | H01L 21/28194 |
| | | | | 257/288 |
| 2011/0159678 | A1 * | 6/2011 | Hsu | H01L 21/82345 |
| | | | | 438/587 |
| 2011/0189847 | A1 * | 8/2011 | Tsai | H01L 21/28 |
| | | | | 438/595 |
| 2014/0027783 | A1 * | 1/2014 | Yin | H01L 21/823431 |
| | | | | 257/77 |
| 2015/0228730 | A1 * | 8/2015 | Yang | H01L 29/207 |
| | | | | 257/369 |
| 2015/0303057 | A1 * | 10/2015 | Lee | H01L 21/02181 |
| | | | | 257/410 |
| 2016/0035861 | A1 * | 2/2016 | Park | H01L 29/66545 |
| | | | | 438/301 |

(Continued)

OTHER PUBLICATIONS

G. Ramanath et al., "Gas-phase transport of WF6 through annular nanopipes in TiN during chemical vapor deposition of W on TiN/Ti/Sio2 structures for integrated circuit fabrication," Appl. Phys, Lett. 69 (21), Nov. 18, 1996, pp. 3179-3181.

*Primary Examiner* — Alexander Ghyka
(74) *Attorney, Agent, or Firm* — Maschoff Brennan

(57) ABSTRACT

The metal-oxide semiconductor structure includes a substrate, a gate dielectric multi-layer, an etch stop layer, a work function metallic layer, a barrier layer and a silicide layer. The substrate has a trench. The gate dielectric multi-layer overlies the trench, in which the gate dielectric multi-layer includes a high-k capping layer with a fluorine concentration substantially in a range from 1 at % to 10 at %. The etch stop layer is disposed on the gate dielectric multi-layer. The work function metallic layer is disposed on the etch stop layer. The barrier layer is disposed on the work function metallic layer. The silicide layer is disposed on the barrier layer.

20 Claims, 22 Drawing Sheets

(56) References Cited

U.S. PATENT DOCUMENTS

2016/0093526 A1\* 3/2016 Engel ............... H01L 21/28562
  438/653
2016/0099321 A1\* 4/2016 Frohberg ........... H01L 29/4175
  257/384

\* cited by examiner

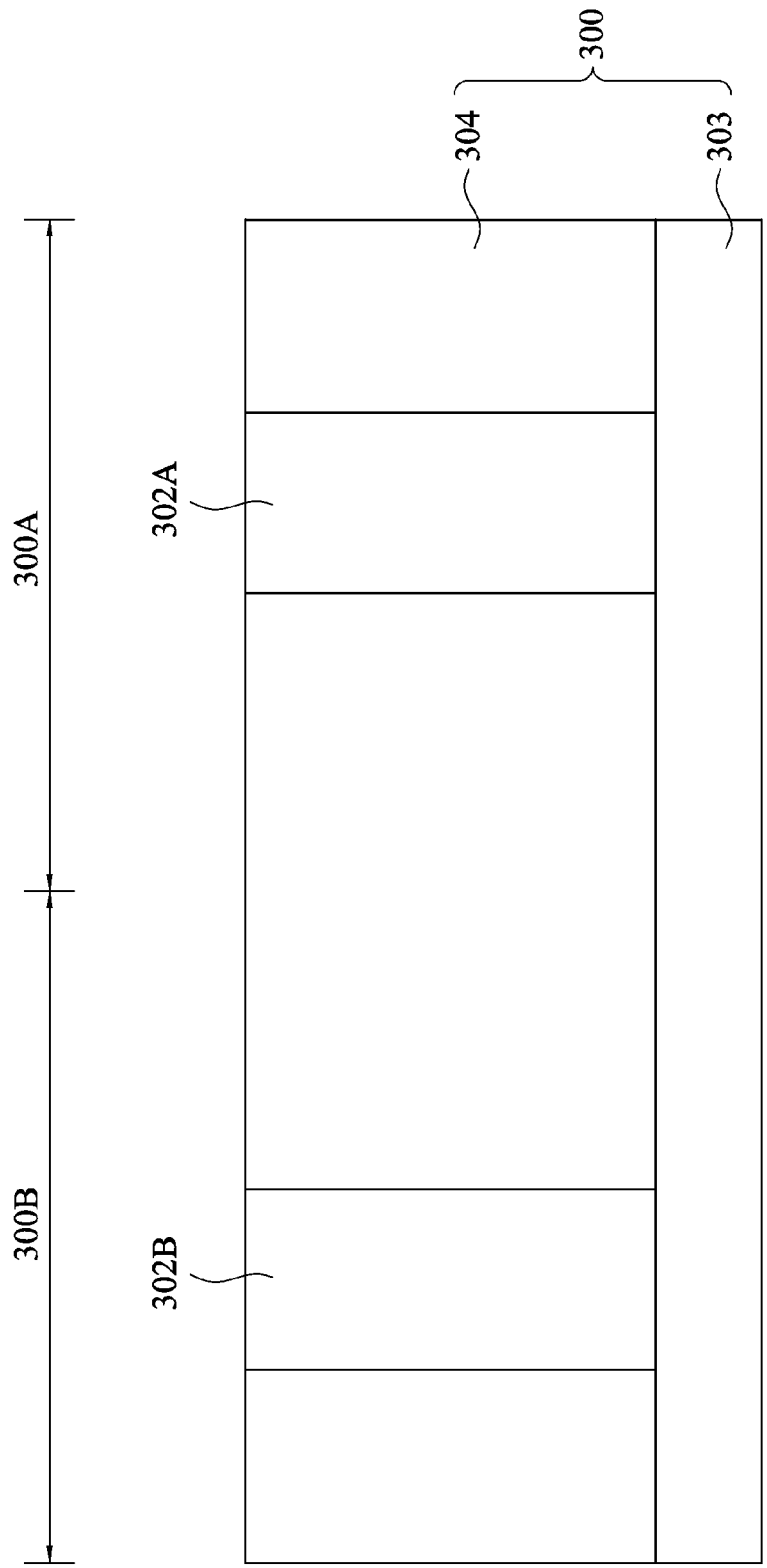

SEMICONDUCTOR DEVICE WITH TUNABLE WORK FUNCTION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs, and for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, an n-type MOS device (NMOS) and a p-type MOS device (PMOS) require different work functions for their respective gate structures. One conventional approach is to use metal layers with different thickness to properly achieve different work functions for the metal gates of the PMOS and NMOS devices. However, the metal layers are difficult to be adjusted in thickness due to a tiny filling window. Another conventional approach is to use an ion implant operation to adjust the work function of the metal gates, but poor conformity occurs due to the shadow effect of a FINFET structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
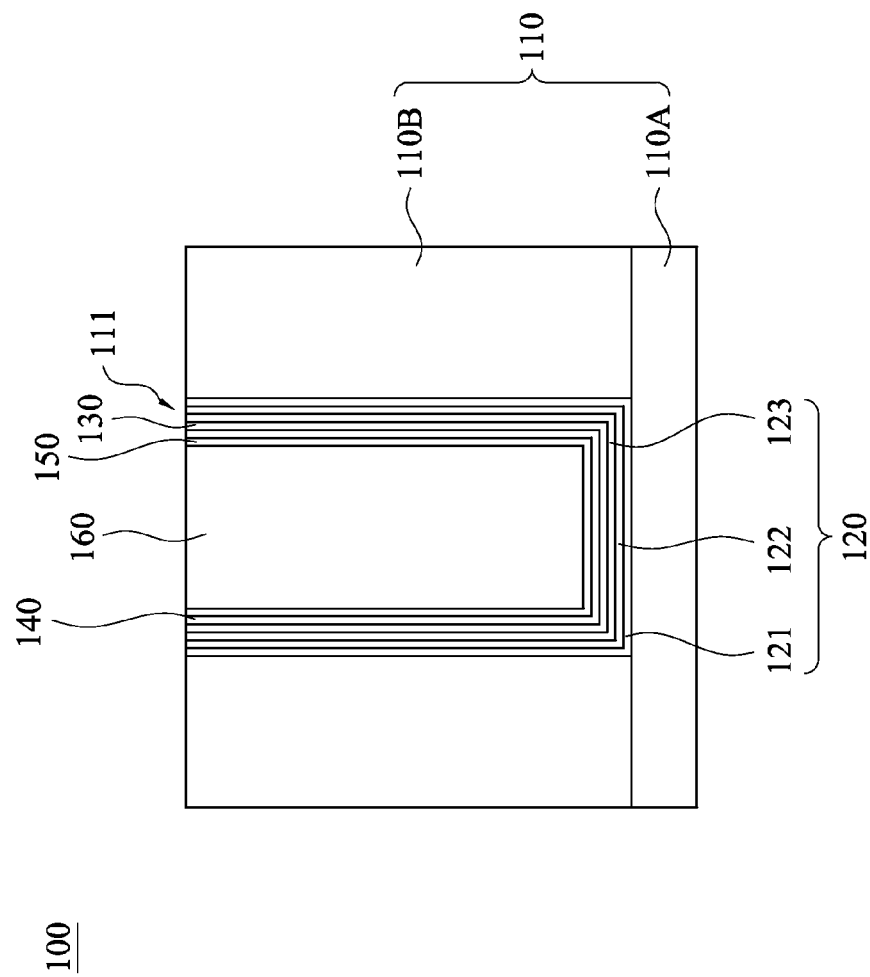
FIG. 1 is a schematic cross-sectional diagram of a metal-oxide semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are directed to a semiconductor device (such as a signal device or a logic device) in which work functions of the metal gates of the PMOS and NMOS devices can be adjusted. The semiconductor device includes at least one metal-oxide semiconductor structure with a high-k capping layer, in which the high-k capping layer has a fluorine concentration in a range from about 1 at % to about 10 at % for adjusting the work function of the high-k capping layer. In some embodiments, a sacrificial layer is used to adjust the fluorine concentration in the high-k capping layer when a tungsten hexafluoride ($WF_6$) thermal treatment is performed. Therefore, the work function of gate electrode can be adjusted without using metal layers of different thickness or an ion implant operation, and thus the aforementioned disadvantages of the conventional approaches can be overcome.

FIG. 1 is a schematic cross-sectional diagram of a metal-oxide semiconductor structure 100 in accordance with some embodiments of the present disclosure. As shown in FIG. 1, the metal-oxide semiconductor structure 100 includes a substrate 110, a gate dielectric multi-layer 120, an etch stop layer 130, a work function metallic layer 140, a barrier layer 150 and a silicide layer 160. In some embodiments, the substrate 110 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate may have a gradient SiGe feature in which the Si and Ge compositions change from one ratio at one location to another ratio at another location of the gradient SiGe feature. In certain embodiments, the alloy SiGe is disposed over a silicon substrate. In alternative embodiments, a SiGe substrate is strained. Furthermore, the semiconductor substrate may be a semiconductor on insulator, such as a silicon on insulator (SOI), or a thin film transistor (TFT). In some embodiments, the semiconductor substrate may include a doped epi layer or a buried layer. In certain embodiments, the compound semiconductor substrate may have a multi-layer structure, or the substrate may include a multi-layer compound semiconductor structure. The substrate 110 has a trench 111. In some embodiments, the substrate 110 may include a dummy gate (not shown) originally, but the dummy gate is removed to form the trench 111. In certain embodiments, the metal-oxide semiconductor structure 100 may be formed in a FINFET structure, and the substrate 110 includes a FIN region 110A and an oxide layer 110B disposed on the FIN region 110A, in which the FIN region 110A may be used as a source/drain region and the oxide layer 110B may be used as an isolation region.

The gate dielectric multi-layer 120 overlies the trench 111. In some embodiments, the gate dielectric multi-layer 120 may include an interfacial layer 121, a high-k dielectric layer 122 and a high-k capping layer 123. The interfacial layer 121 may include a silicon oxide layer with a thickness ranging from about 5 angstroms to about 10 angstroms. The high-k dielectric layer 122 may be disposed on the interfacial layer 121 by using atomic layer deposition (ALD) or other suitable technique. The high-k dielectric layer 122 may have a thickness ranging from about 10 angstroms to about 40 angstroms. The high-k dielectric layer 122 may include hafnium oxide ($HfO_2$). In some embodiments, the high-k dielectric layer 122 may optionally include other high-k dielectrics such as hafnium silicon oxide (HfSiO), hafnium silicon oxynitride (HfSiON), hafnium tantalum oxide (HMO), hafnium titanium oxide (HfTiO), hafnium zirconium oxide (HfZrO), or combinations thereof. The high-k capping layer 123 is disposed on the high-k dielectric layer for tuning a work function of the work function metallic layer 140 (for the gate electrode) for properly performing as an N-type metal-oxide-semiconductor (NMOS) transistor device and a P-type MOS (PMOS) transistor device, respectively. In some embodiments, the high-k capping layer 123 has a fluorine concentration in a range from about 1 at % to about 10 at %. In alternative embodiments, the high-k capping layer 123 may be formed from materials including TiN or TaN. In certain embodiments, when the metal-oxide semiconductor structure 100 is used as a p-type MOS (PMOS) transistor device and the fluorine concentration is within a range from about 1 at % to about 10 at %, a threshold voltage of the PMOS transistor device may be reduced in a range from about 25 mV to 100 mV. In alternative embodiments, when the metal-oxide semiconductor structure 100 is used as a n-type MOS (NMOS) transistor device and the fluorine concentration is within a range from about 1 at % to about 10 at %, a threshold voltage of the NMOS transistor device may be increased in a range from about 25 mV to 100 mV. In some embodiments, the fluorine concentration may be within a range from about 1 at % to about 4 at %.

The etch stop layer 130 is disposed on the gate dielectric multi-layer 120. In some embodiments, the etch stop layer 130 may be formed from a commonly used material including, but not limited to, SiNx, SiOx, SiON, SiC, SiCN, BN, SiBN, SiCBN, TiN, TaN or combinations thereof. In alternative embodiments, the first etch stop layer 130 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like also can be used.

The work function metallic layer 140 is disposed on the etch stop layer. In some embodiments, the work function metallic layer 140 may be a n-type work function metallic layer. The n-type work function metallic layer can include materials such as metal, metal carbide, metal nitride, other materials that can provide a desired work function for transistors, or the combinations thereof. In some embodiments, the n-type work function metallic layer can include materials such as hafnium, zirconium, titanium, tantalum, aluminum, metal carbides, other materials that can provide a desired work function for transistors, or the combinations thereof. In other embodiments, the n-type work function metallic layer can be formed from TiAl. The n-type work function metallic layer may be capable of providing a work function value of about 4.3 eV.

In some embodiments, the work function metallic layer 140 may include a n-type work function metallic layer and a p-type work function metallic layer, in which the p-type work function metallic layer is disposed on the etch stop layer, and the n-type work function metallic layer is disposed on the p-type work function metallic layer. In some embodiments, the p-type work function metallic layer can include materials such as metal, metal carbide, metal nitride, other materials that can provide a desired work function for transistors, or the combinations thereof. In some embodiments, the p-type work function metallic layer can include a material such as ruthenium, palladium, platinum, cobalt, nickel, and conductive metal oxides, e.g., ruthenium oxide, other materials that can provide a desired work function for transistors, or the combinations thereof. In other embodiments, the p-type work function metallic layer can include TiN. The p-type work function metallic layer is capable of providing a work function value of about 4.8 eV.

The barrier layer 150 is disposed on the work function metallic layer 140. In some embodiments, the barrier layer 150 may be formed from materials including TaN or TiN. The barrier layer 150 may have a thickness ranging from about 10 angstroms to about 20 angstroms. The barrier layer 150 may be formed by using various deposition techniques such as ALD, PVD, CVD, or other suitable techniques.

The silicide layer 160 is disposed on the barrier layer 150. In some embodiments, the silicide layer 160 can be configured to provide an electrical transmission. In some embodiments, the silicide layer 160 may be formed from materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), tungsten other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a rapid thermal process (RTP). The reacted silicide may be formed by a one-step RTP or multiple-step RTPs.

Figure 2:
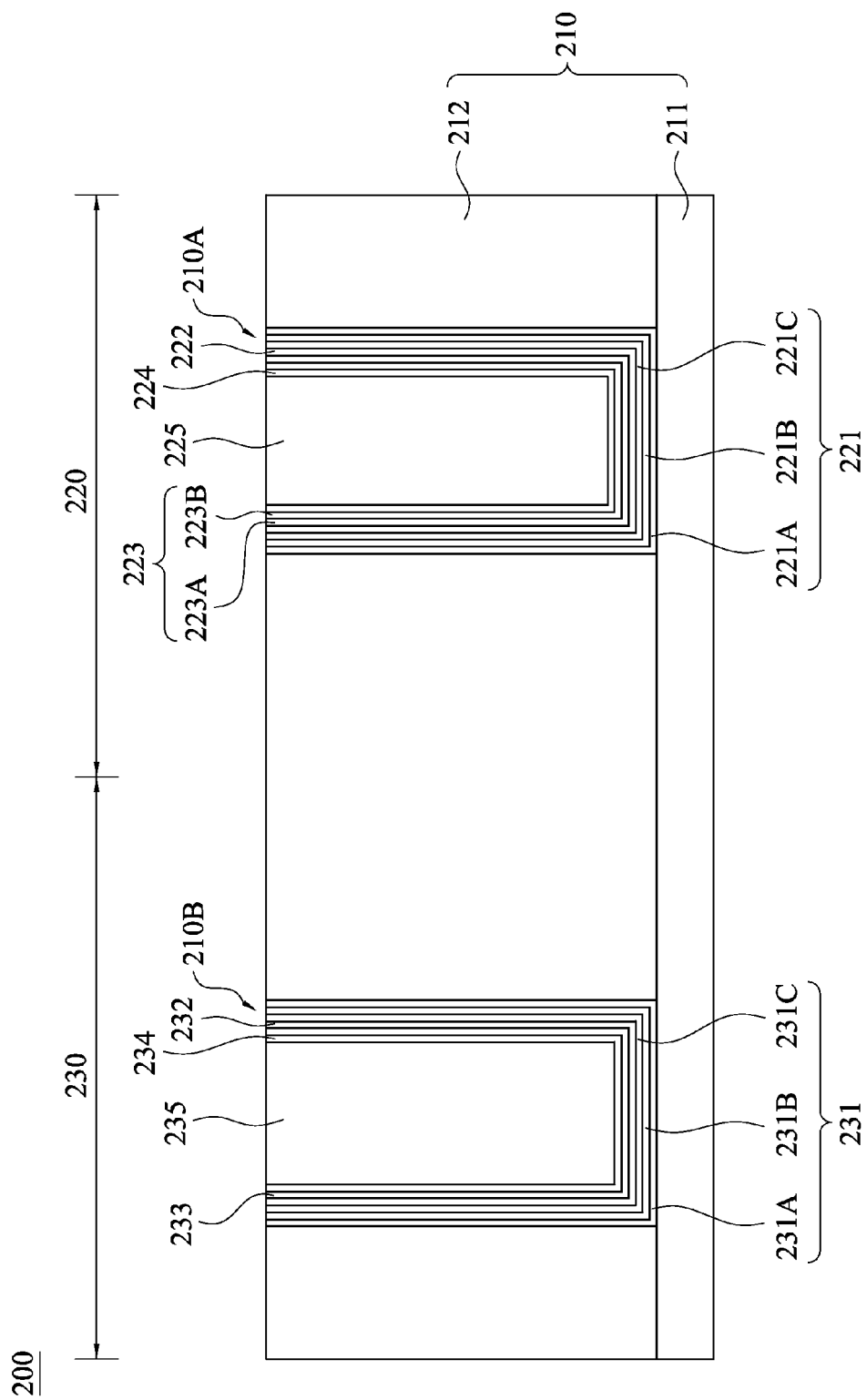
FIG. 2 is a schematic cross-sectional diagram of a semiconductor device in accordance with some embodiments of the present disclosure.

FIG. 2 is a schematic cross-sectional diagram of a semiconductor device 200 in accordance with some embodiments of the present disclosure. As shown in FIG. 2, the semiconductor device 200 includes a substrate 210, a first metal-oxide semiconductor structure 220 and a second metal-oxide semiconductor structure 230. In some embodiments, the substrate 210 may include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate may have a gradient SiGe feature in which the Si and Ge compositions change from one ratio at one location to another ratio at another location of the gradient SiGe feature. In certain embodiments, the alloy SiGe is disposed over a silicon substrate. In alternative embodiments, a SiGe substrate is strained. Furthermore, the semiconductor substrate may be a semiconductor on insulator, such as a silicon on insulator (SOI), or a thin film transistor (TFT). In some embodiments, the semiconductor substrate may include a doped epi layer or a buried layer. In certain embodiments, the compound semiconductor substrate may have a multi-layer structure, or the substrate may include a multi-layer compound semiconductor structure. In alternative embodiments, the semiconductor device 200 may be formed in a FINFET structure, and the substrate 210 includes a FIN region 211 and an oxide layer 212 disposed on the FIN region 211, in which the FIN region 211 may be used as a source/drain region and the oxide layer 212 may be used as an isolation region. The substrate 210 has a first trench 210A and a second trench 210B.

The first metal-oxide semiconductor structure 220 is disposed on the substrate 210. In some embodiments, the first metal-oxide semiconductor structure 220 is a p-type metal-oxide semiconductor structure. The first metal-oxide semiconductor structure 220 includes a first gate dielectric multi-layer 221, a first etch stop layer 222, a first work function metallic layer 223, a first barrier layer 224 and a first silicide layer 225. The first gate dielectric multi-layer 221 overlies the first trench 210A. In some embodiments, the gate dielectric multi-layer 120 may include a first interfacial layer 221A, a first high-k dielectric layer 221B and a first high-k capping layer 221C. The first interfacial layer 221A may include a silicon oxide layer with a thickness ranging from about 5 angstroms to about 10 angstroms. The first high-k dielectric layer 221B may be disposed on the interfacial layer 221A by using atomic layer deposition (ALD) or another suitable technique. The first high-k dielectric layer 221B may have a thickness ranging from about 10 angstroms to about 40 angstroms. The first high-k dielectric layer 221B may include hafnium oxide ($HfO_2$). In some embodiments, the first high-k dielectric layer 221B may optionally include other high-k dielectrics such as hafnium silicon oxide (HfSiO), hafnium silicon oxynitride (HfSiON), hafnium tantalum oxide (HMO), hafnium titanium oxide (HfTiO), hafnium zirconium oxide (HfZrO), or combinations thereof. The first high-k capping layer 221C is disposed on the high-k dielectric layer for tuning a work function of the first work function metallic layer 223. In some embodiments, the first high-k capping layer 221C has a first fluorine concentration in a range from about 1 at % to about 10 at %. In alternative embodiments, the first high-k capping layer 221C may be formed from materials including TiN or TaN. In certain embodiments, the first fluorine concentration is within a range from about 1 at % to about 4 at %.

The first etch stop layer 222 is disposed on the first gate dielectric multi-layer 221. In some embodiments, the first etch stop layer 222 may be formed from a commonly used material including, but not limited to, SiNx, SiOx, SiON, SiC, SiCN, BN, SiBN, SiCBN, TiN, TaN or the combinations thereof. In alternative embodiments, the first etch stop layer 222 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like also can be used.

The first work function metallic layer 223 is disposed on the first etch stop layer 222. In some embodiments, the first work function metallic layer 223 may include a p-type work function metallic layer 223A and a n-type work function metallic layer 223B, in which the p-type work function metallic layer 223A is disposed on the etch stop layer 222, and the n-type work function metallic layer 223B is disposed on the p-type work function metallic layer 223A. In some embodiments, the p-type work function metallic layer 223A can include materials such as metal, metal carbide, metal nitride, other materials that can provide a desired work function for transistors, or the combinations thereof. In some embodiments, the p-type work function metallic layer can include a material such as ruthenium, palladium, platinum, cobalt, nickel, and conductive metal oxides, e.g., ruthenium oxide, or the combinations thereof. In other embodiments, the p-type work function metallic layer 223A can include TiN. The p-type work function metallic layer 223A is capable of providing a work function value of about 4.8 eV. In some embodiments, the n-type work function metallic layer 223B can include materials such as metal, metal carbide, metal nitride, other materials that can provide a desired work function for transistors. In some embodiments, the n-type work function metallic layer 223B can include materials such as hafnium, zirconium, titanium, tantalum, aluminum, metal carbides, other materials that can provide a desired work function for transistors, or the combinations thereof. In other embodiments, the n-type work function metallic layer 223B can be formed from TiAl. The n-type work function metallic layer 223B may be capable of providing a work function value of about 4.3 eV.

The first barrier layer 224 is disposed on the first work function metallic layer 223. In some embodiments, the first barrier layer 224 may be formed from materials including TaN or TiN. The first barrier layer 224 may have a thickness ranging from about 10 angstroms to about 20 angstroms. The first barrier layer 224 may be formed by using various deposition techniques such as ALD, PVD, CVD, or other suitable techniques.

The first silicide layer 225 is disposed on the first barrier layer 224. In some embodiments, the first silicide layer 225 can be configured to provide an electrical transmission. In some embodiments, the first silicide layer 225 may be formed from materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), tungsten, other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDP-CVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may be formed by a one-step RTP or multiple-step RTPs.

The second metal-oxide semiconductor structure 230 is disposed on the substrate 210 and adjacent to the first metal-oxide semiconductor structure 220. In certain embodiments, the second metal-oxide semiconductor structure 230 is a n-type metal-oxide semiconductor structure. The second metal-oxide semiconductor structure 230 is disposed on the substrate 210. In some embodiments, the second metal-oxide semiconductor structure 230 may includes a second gate dielectric multi-layer 231, a second etch stop layer 232, a second work function metallic layer 233, a second barrier layer 234 and a second silicide layer 235. The second gate dielectric multi-layer 231 overlies the second trench 210B. In some embodiments, the second gate dielectric multi-layer 231 may include a second interfacial layer 231A, a second high-k dielectric layer 231B and a second high-k capping layer 231C. The second interfacial layer 231A may include a silicon oxide layer with a thickness ranging from about 5 angstroms to about 10 angstroms. The second high-k dielectric layer 231B may be disposed on the second interfacial layer 231A by using atomic layer deposition (ALD) or other suitable technique. The second high-k dielectric layer 231B may have a thickness ranging from about 10 angstroms to about 40 angstroms. The second high-k dielectric layer 231B may include hafnium oxide ($HfO_2$). In some embodiments, the second high-k dielectric layer 231B may optionally include other high-k dielectrics such as hafnium silicon oxide (HfSiO), hafnium silicon oxynitride (HfSiON), hafnium tantalum oxide (HMO), hafnium titanium oxide (HfTiO), hafnium zirconium oxide (HfZrO), or combinations thereof. The second high-k capping layer 231C is disposed on the second high-k dielectric layer 231B for tuning a work function of the second work function metallic layer 233. In some embodiments, the second high-k capping layer 231C has a second fluorine concentration in a range from about 1 at % to about 10 at %. In alternative embodiments, the second high-k capping layer 231C may be formed from materials including TiN or TaN. In certain embodiments, the second fluorine concentration is within a range from about 1 at % to about 4 at %.

The second etch stop layer 232 is disposed on the second gate dielectric multi-layer 231. In some embodiments, the second etch stop layer 232 may be formed from a commonly used material including, but not limited to, SiNx, SiOx, SiON, SiC, SiCN, BN, SiBN, SiCBN, TiN, TaN, or combinations thereof. In alternative embodiments, the second etch stop layer 232 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like also can be used.

The second work function metallic layer 233 is disposed on the second etch stop layer 232. In some embodiments, the second work function metallic layer 233 may be a n-type work function metallic layer. The n-type work function metallic layer can include materials such as metal, metal carbide, metal nitride, other materials that can provide a desired work function for transistors, or the combinations thereof. In some embodiments, the n-type work function metallic layer can include materials such as hafnium, zirconium, titanium, tantalum, aluminum, metal carbides, other materials that can provide a desired work function for transistors, or the combinations thereof. In other embodiments, the n-type work function metallic layer can be formed from TiAl. The n-type work function metallic layer may be capable of providing a work function value of about 4.3 eV.

The second barrier layer 234 is disposed on the second work function metallic layer 233. In some embodiments, the second barrier layer 234 may be formed from materials including TaN or TiN. The second barrier layer 234 may have a thickness ranging from about 10 angstroms to about 20 angstroms. The second barrier layer 234 may be formed by using various deposition techniques such as ALD, PVD, CVD, or other suitable techniques.

The second silicide layer 235 is disposed on the second barrier layer 234. In some embodiments, the second silicide layer 235 can be configured to provide an electrical transmission. In some embodiments, the second silicide layer 235 may be formed from materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), tungsten, other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may be formed by a one-step RTP or multiple-step RTPs.

Figure 3B:
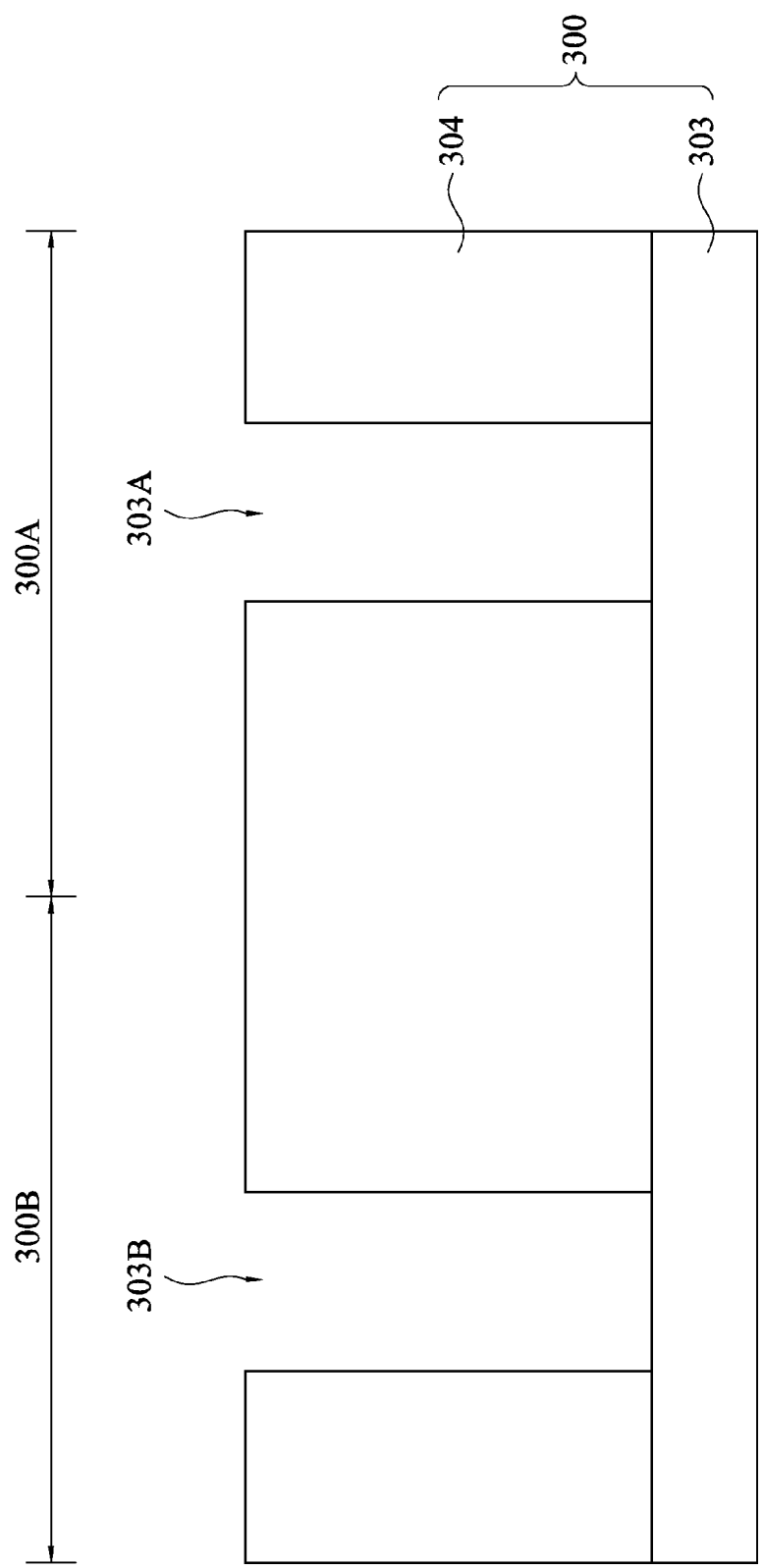
FIG. 3A to FIG. 3S are schematic cross-sectional views of intermediate stages showing a method for fabricating a semiconductor device in accordance with some embodiments of the present disclosure.
Figure 3C:
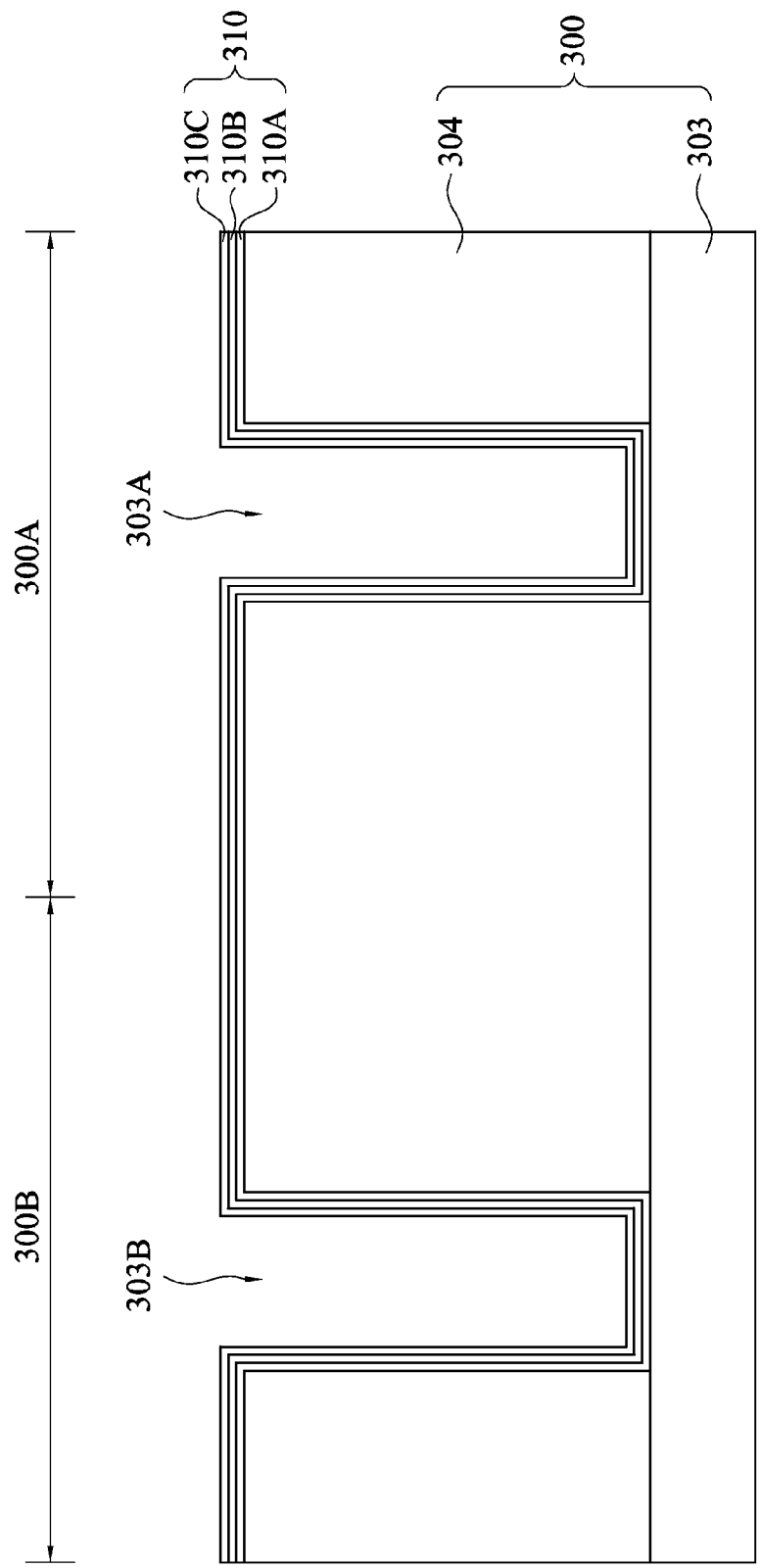
Figure 3D:
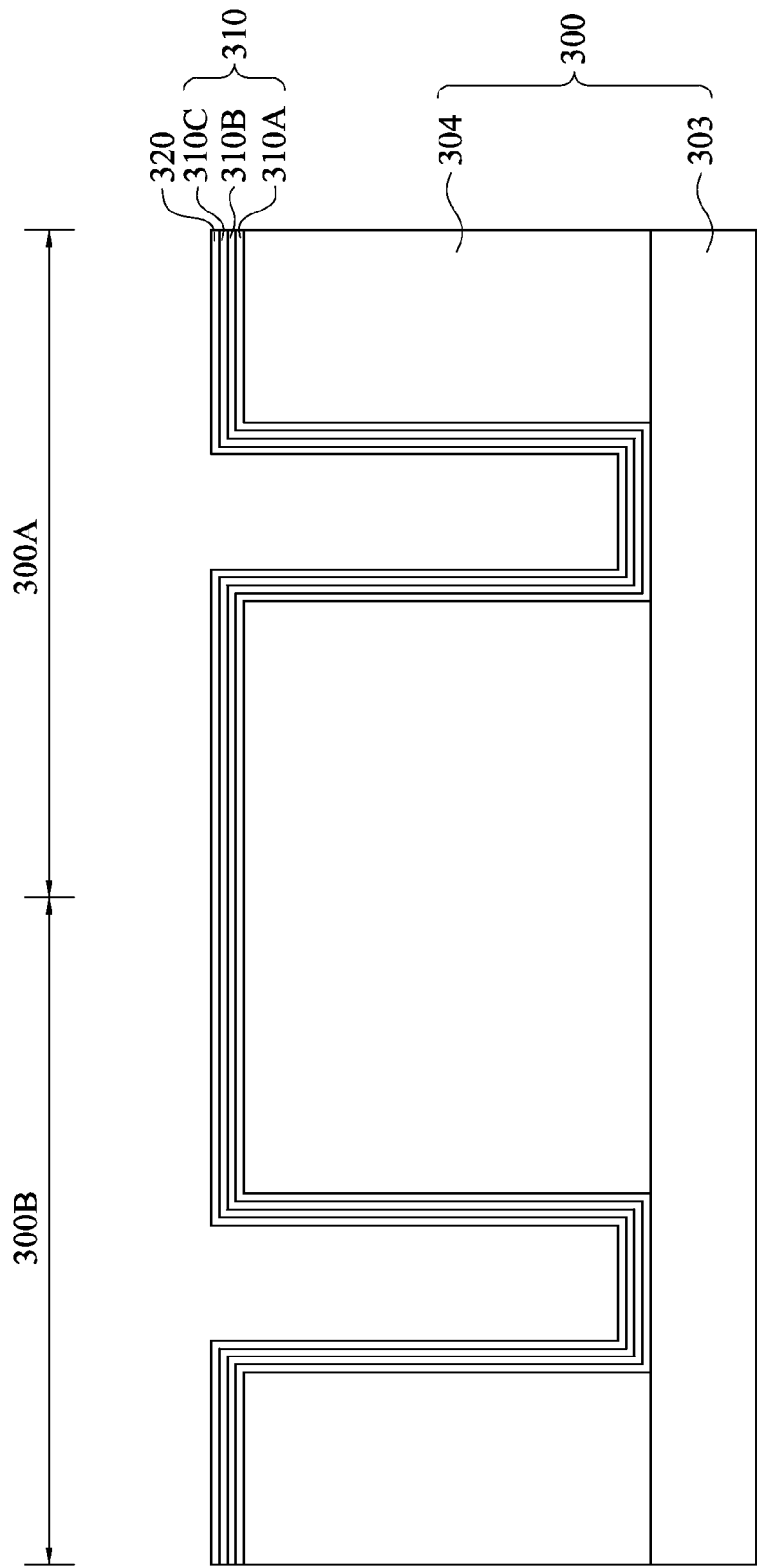
Figure 3E:
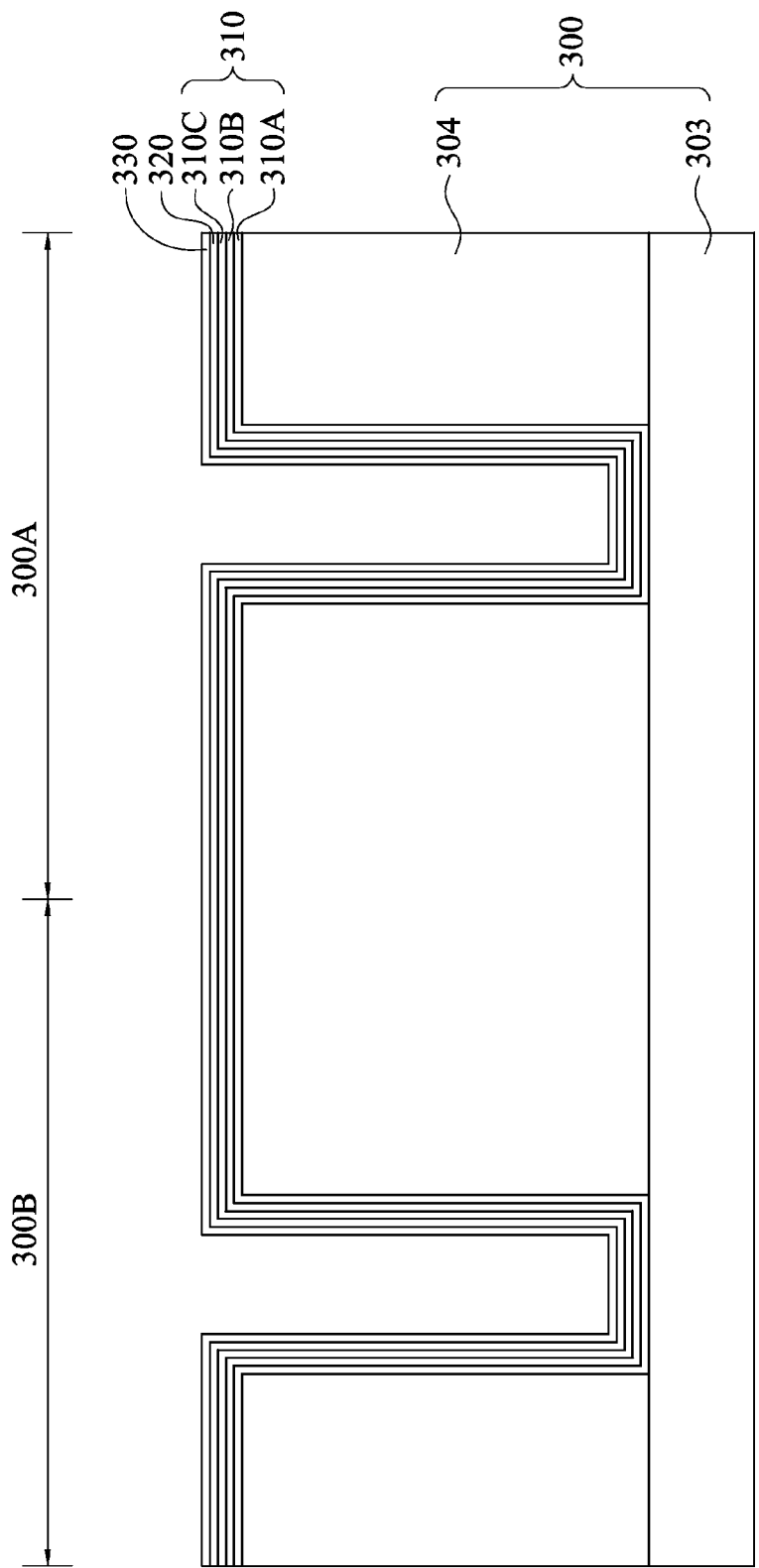
Figure 3F:
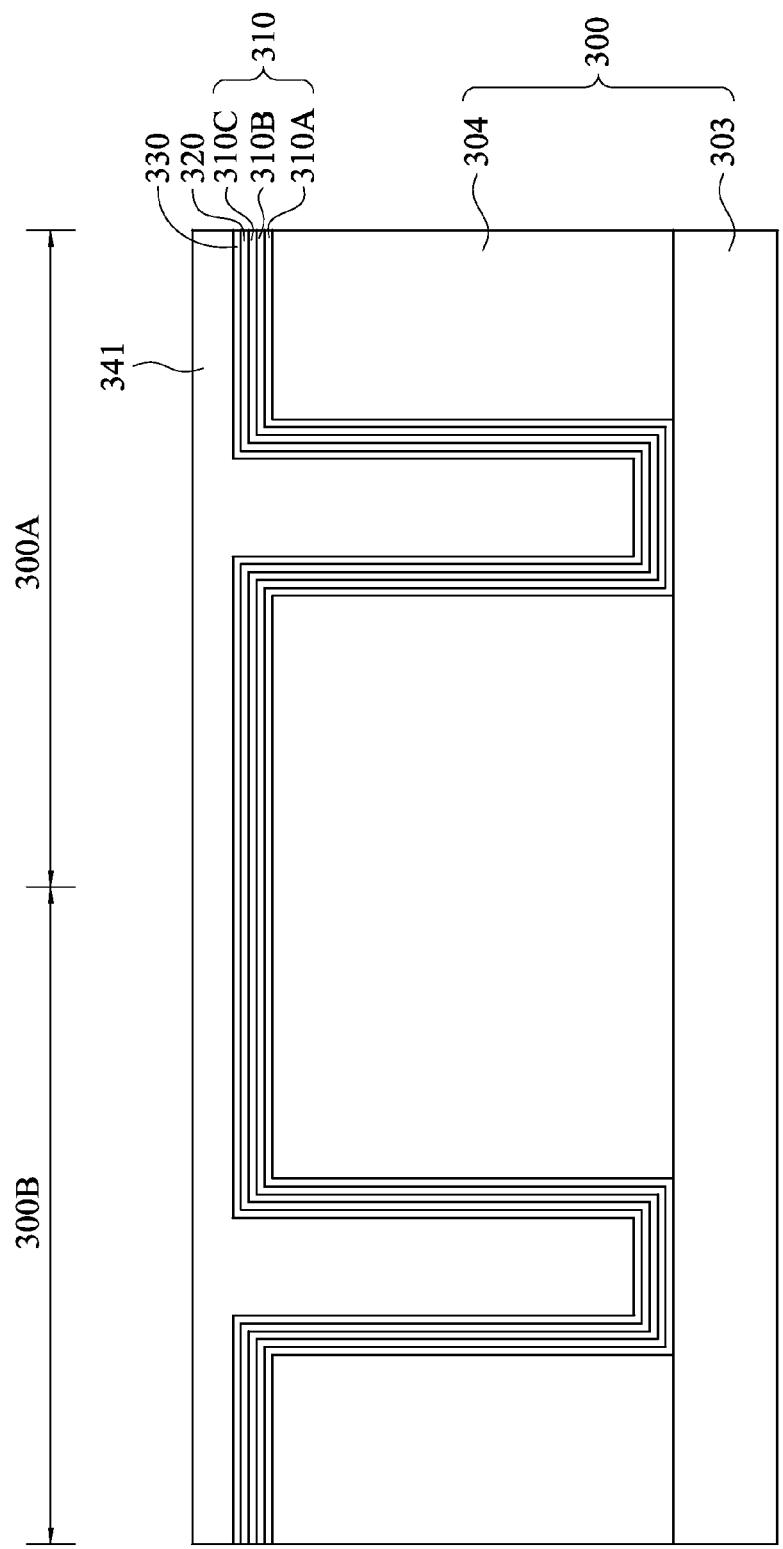
Figure 3G:
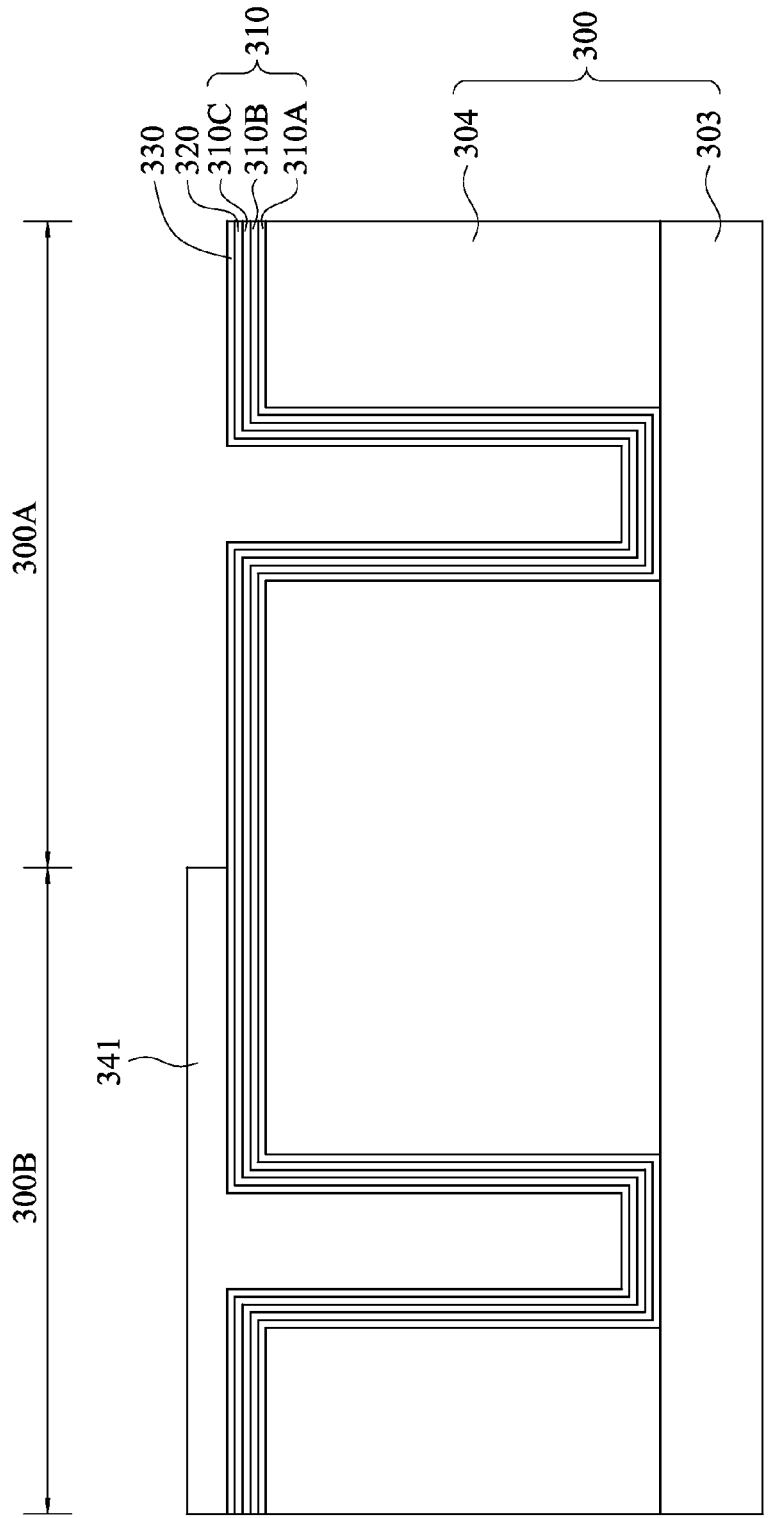
Figure 3H:
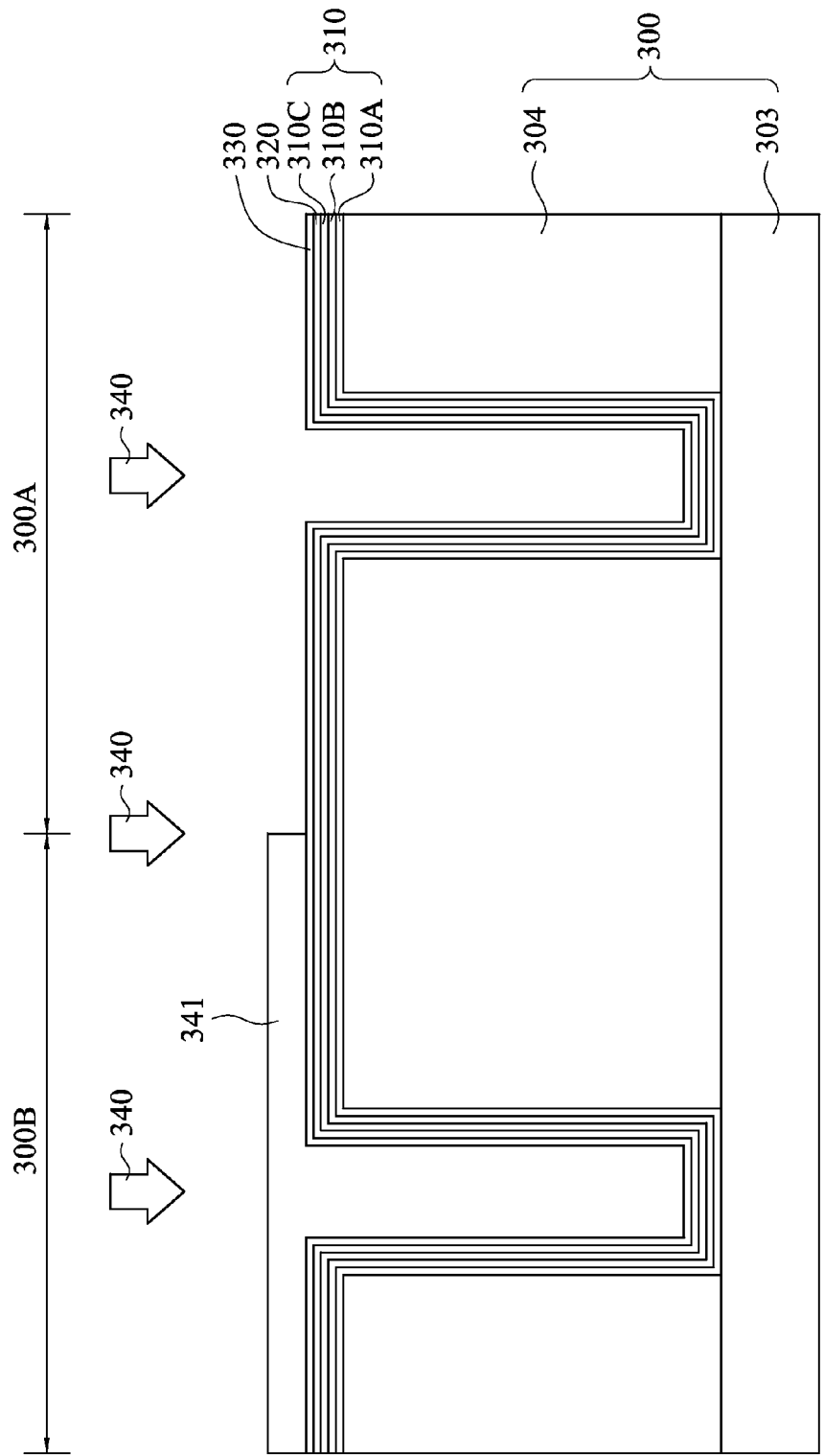
Figure 3I:
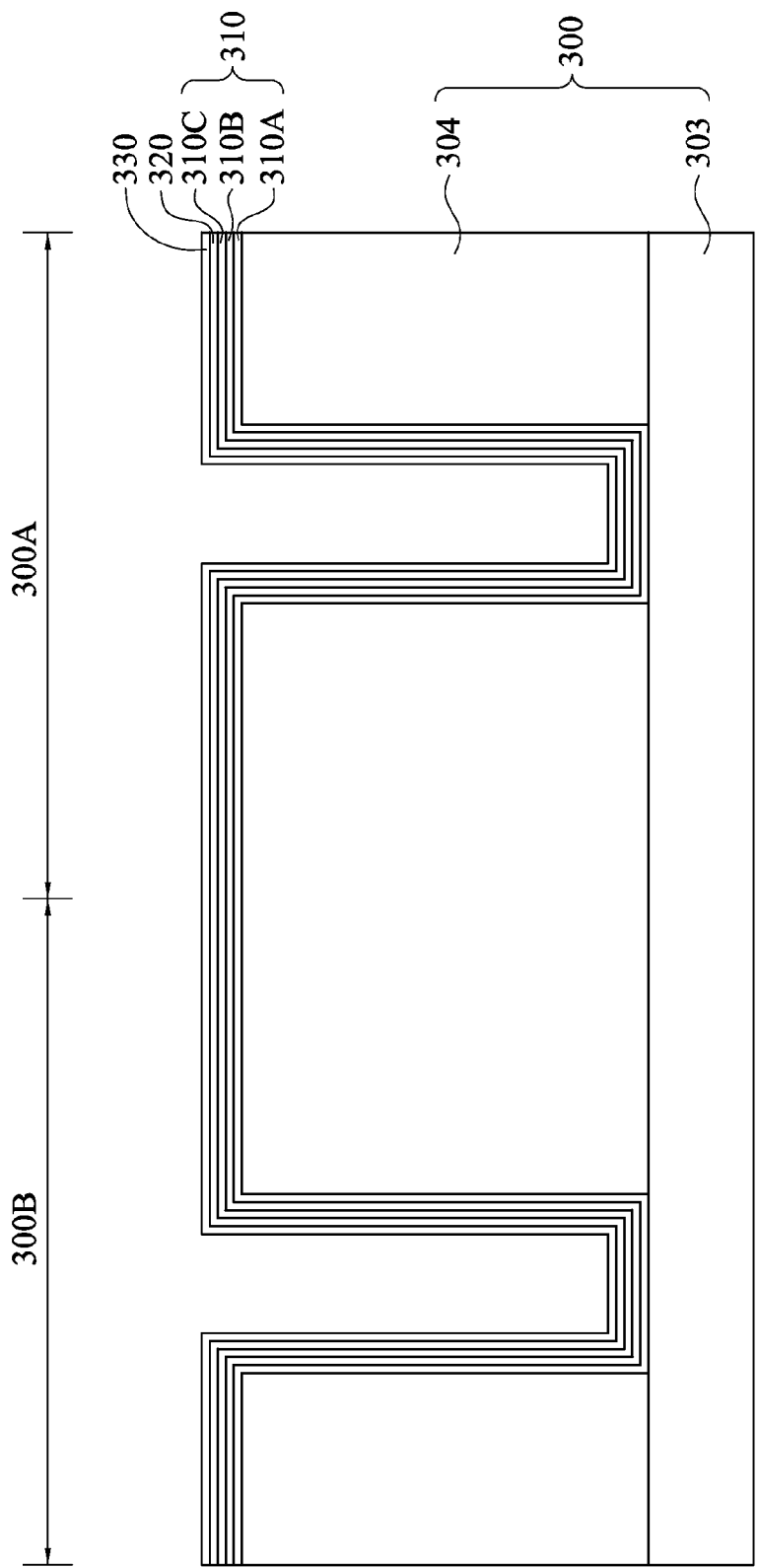
Figure 3J:
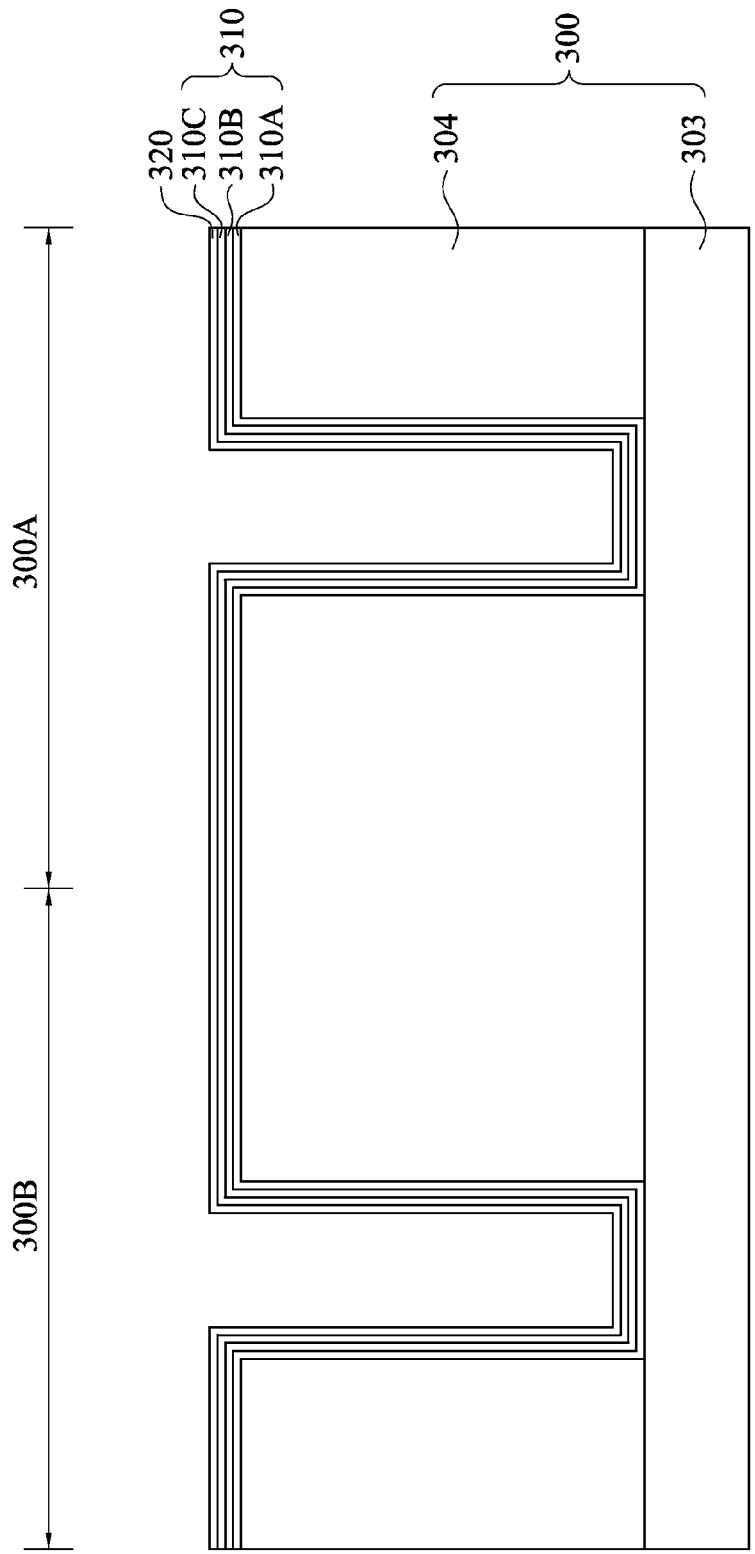
Figure 3K:
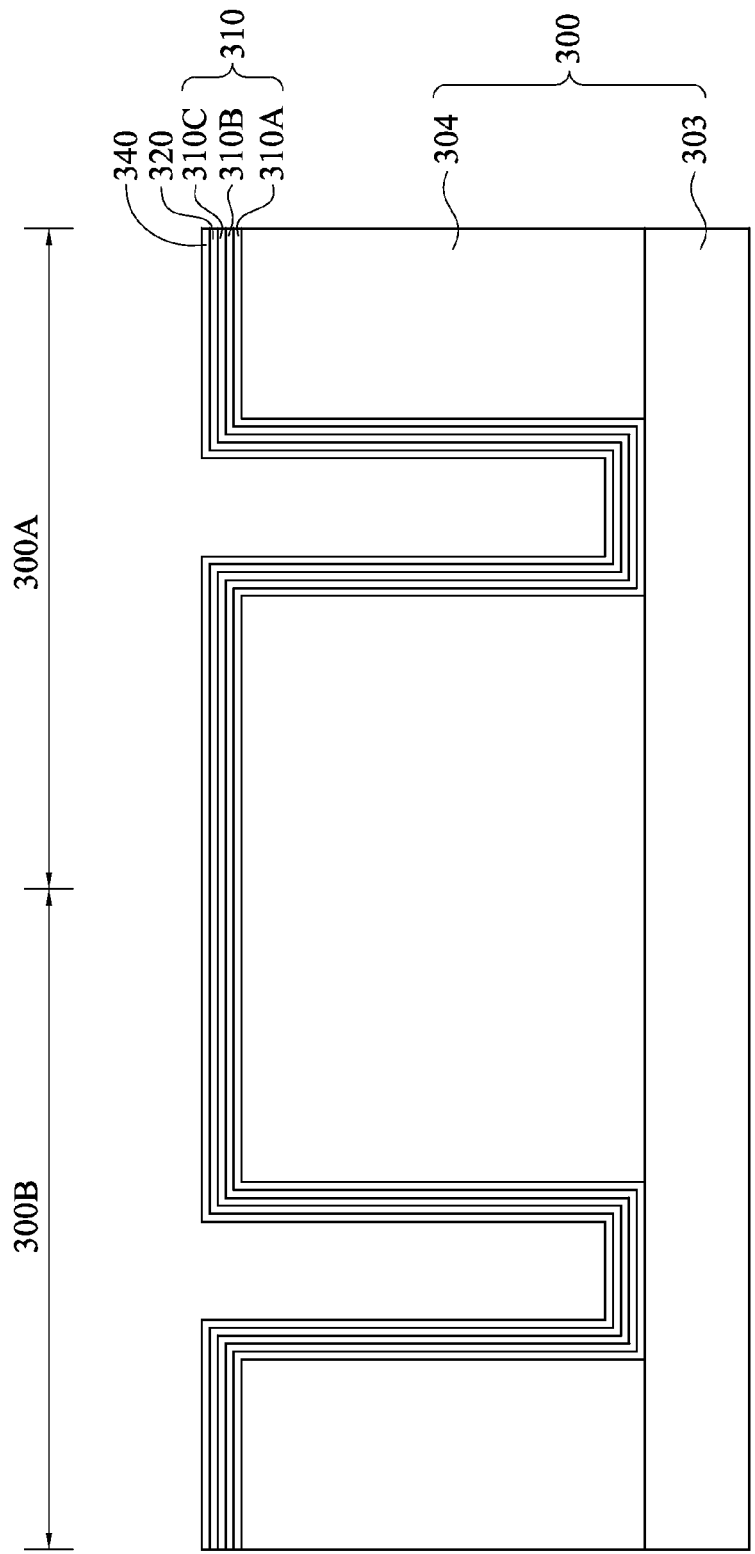
Figure 3L:
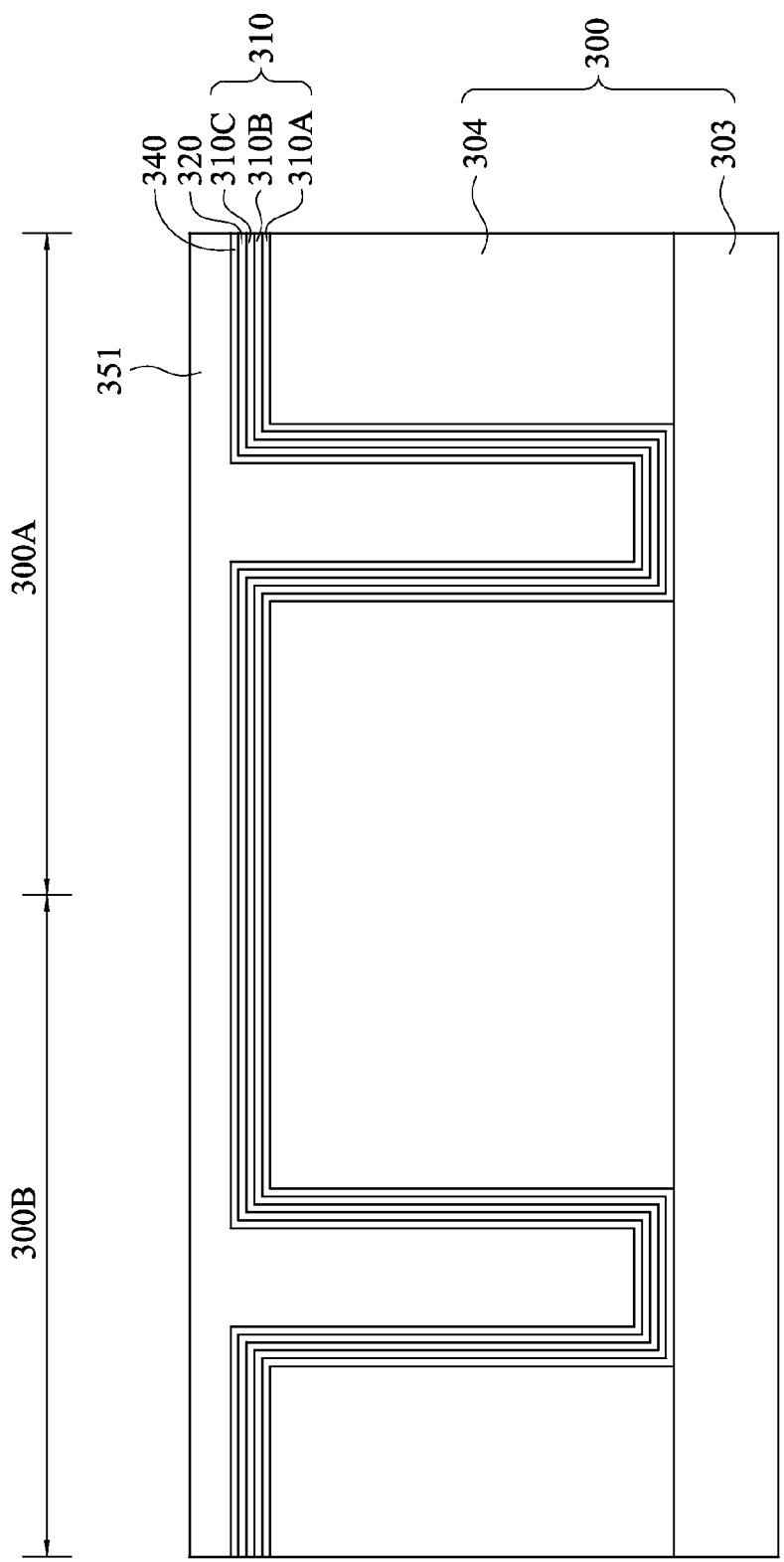
Figure 3M:
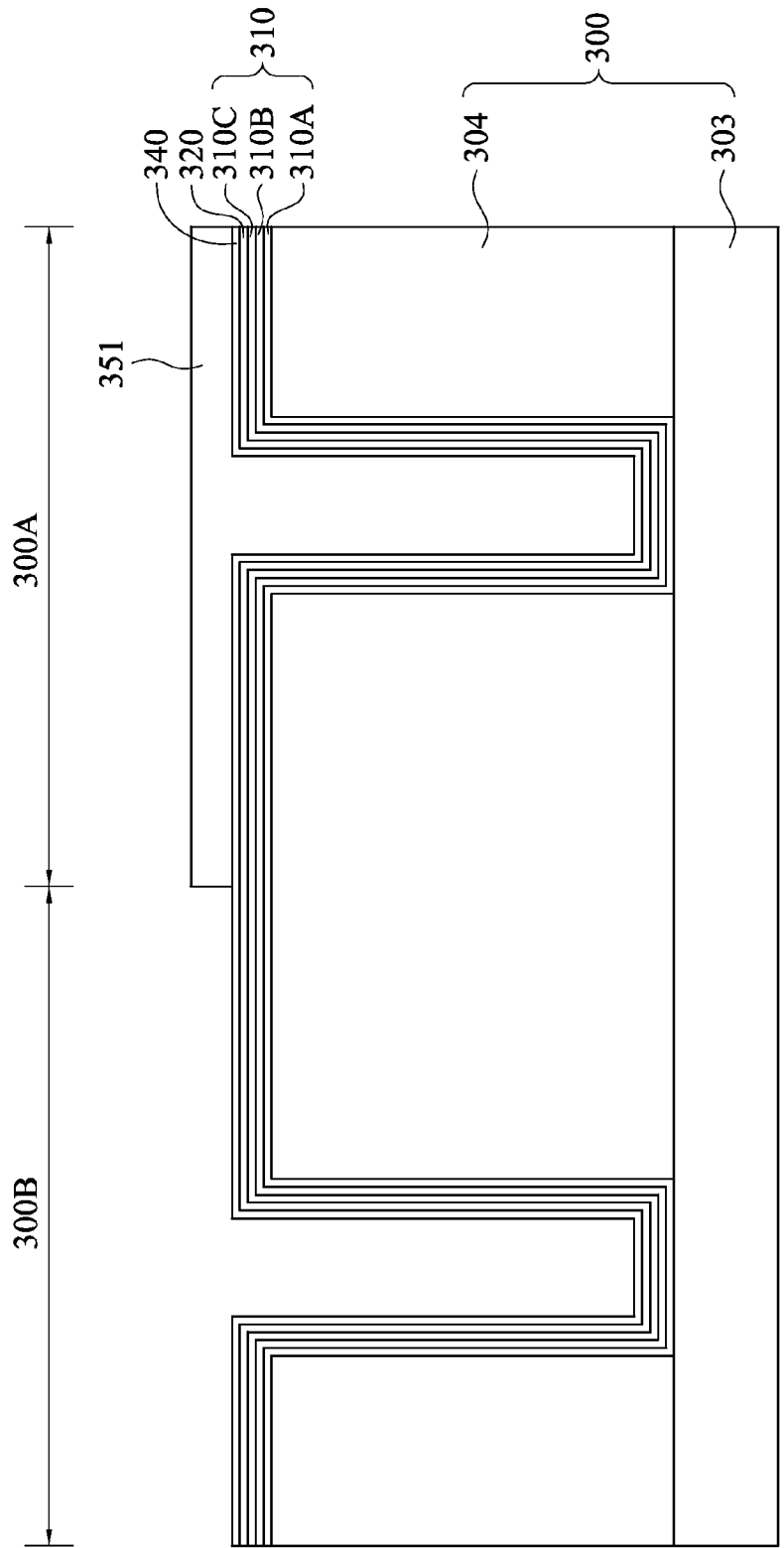
Figure 3N:
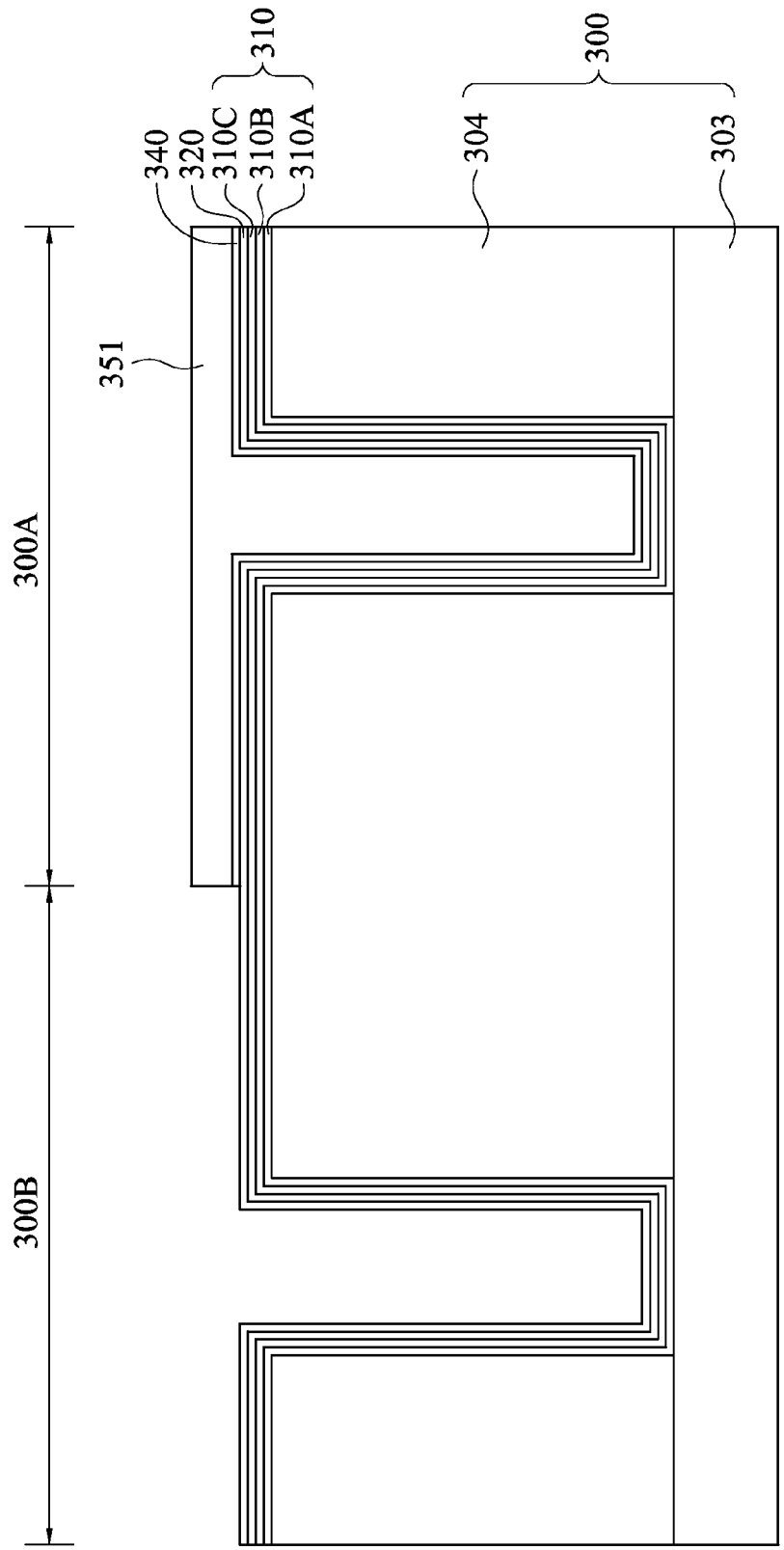
Figure 3O:
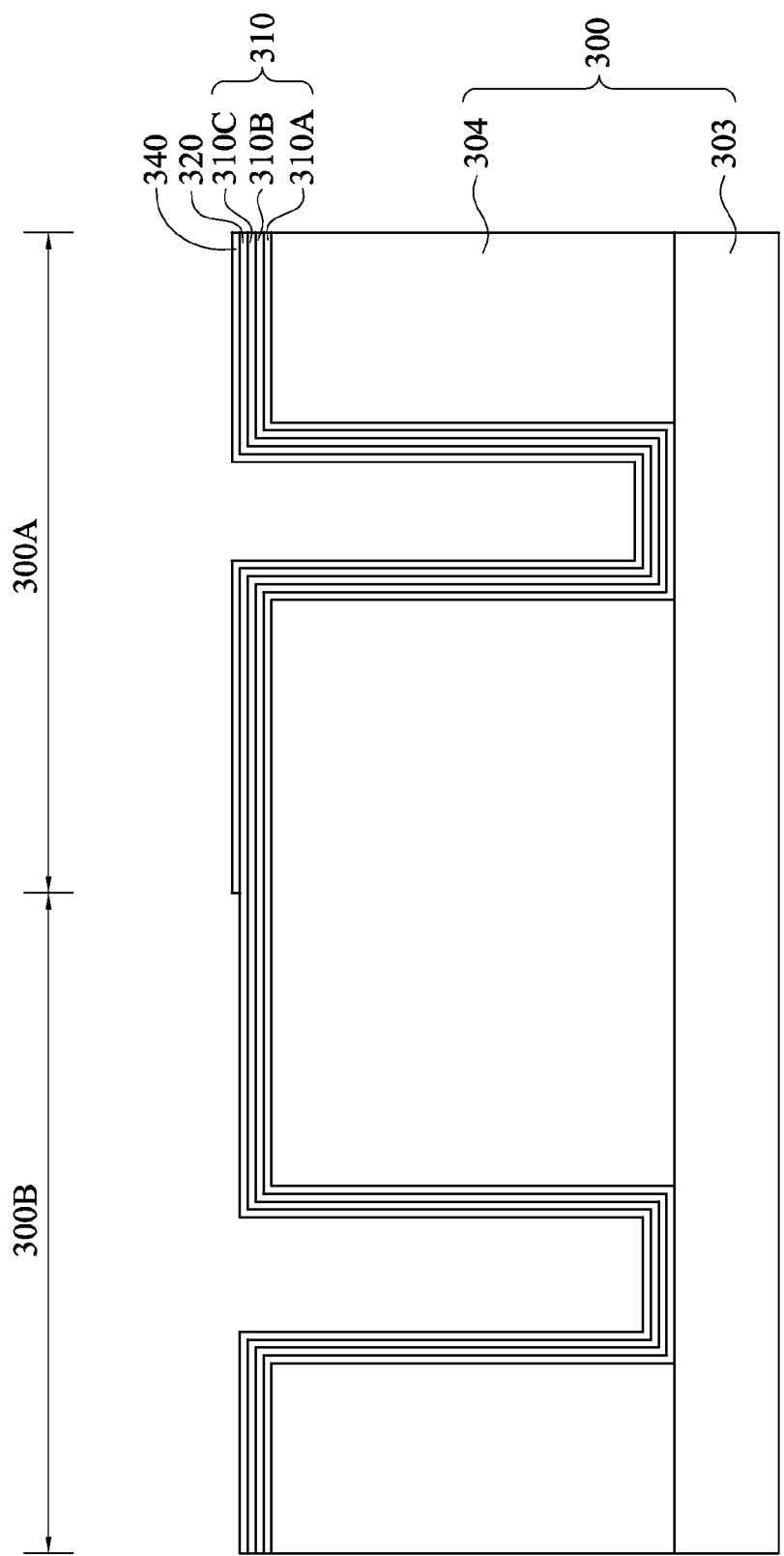
Figure 3P:
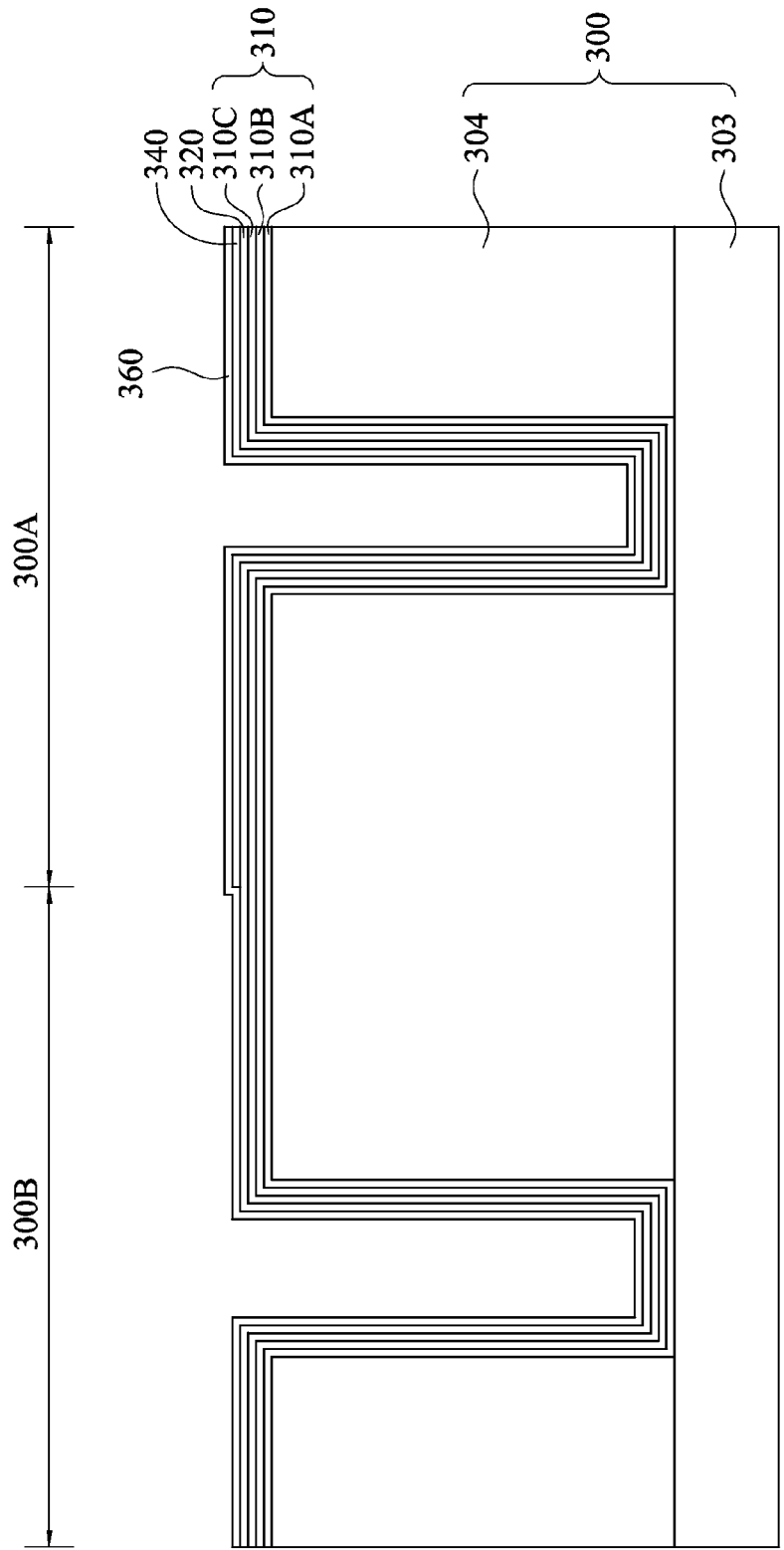
Figure 3Q:
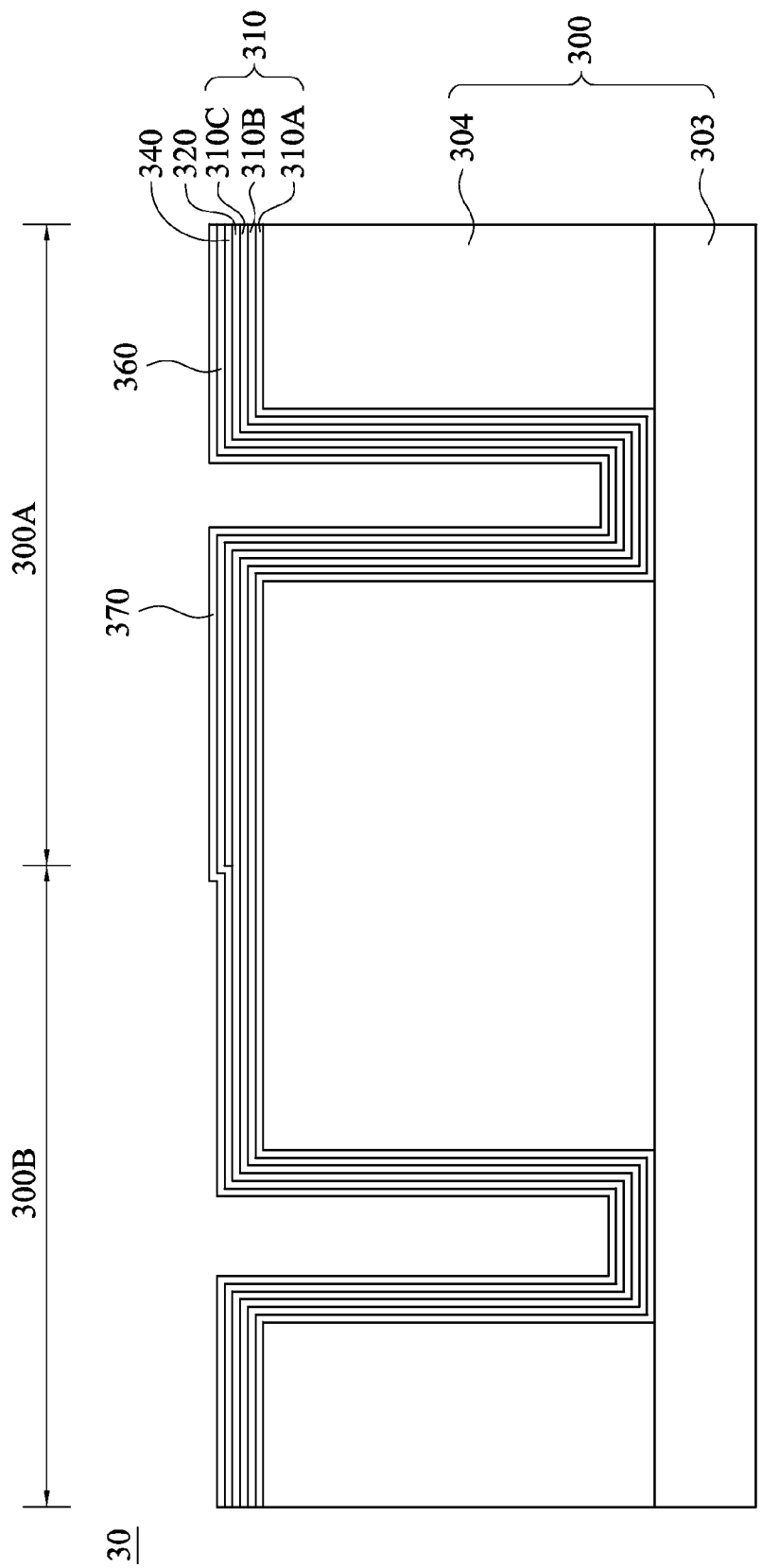
Figure 3R:
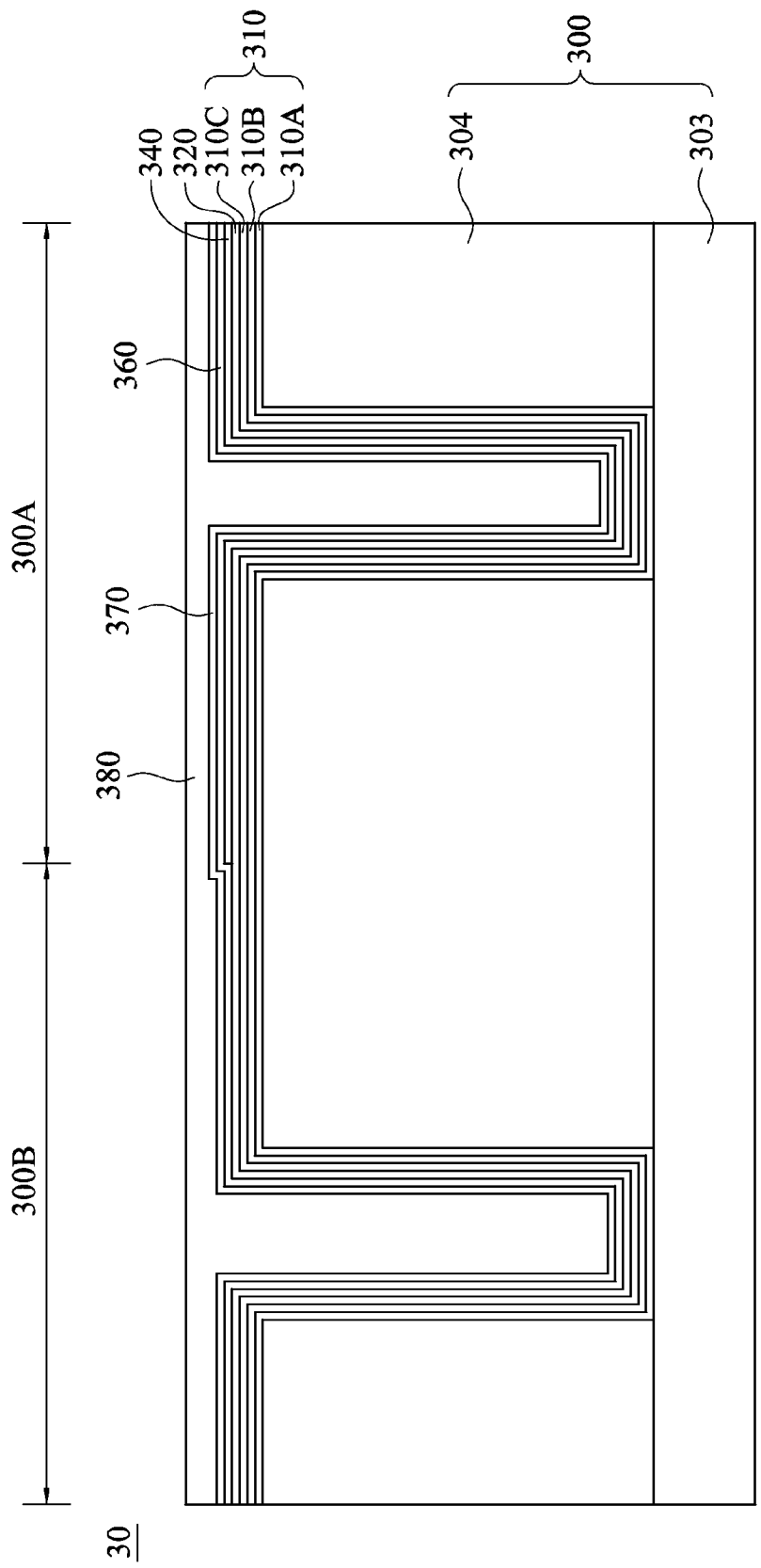
Figure 3S:
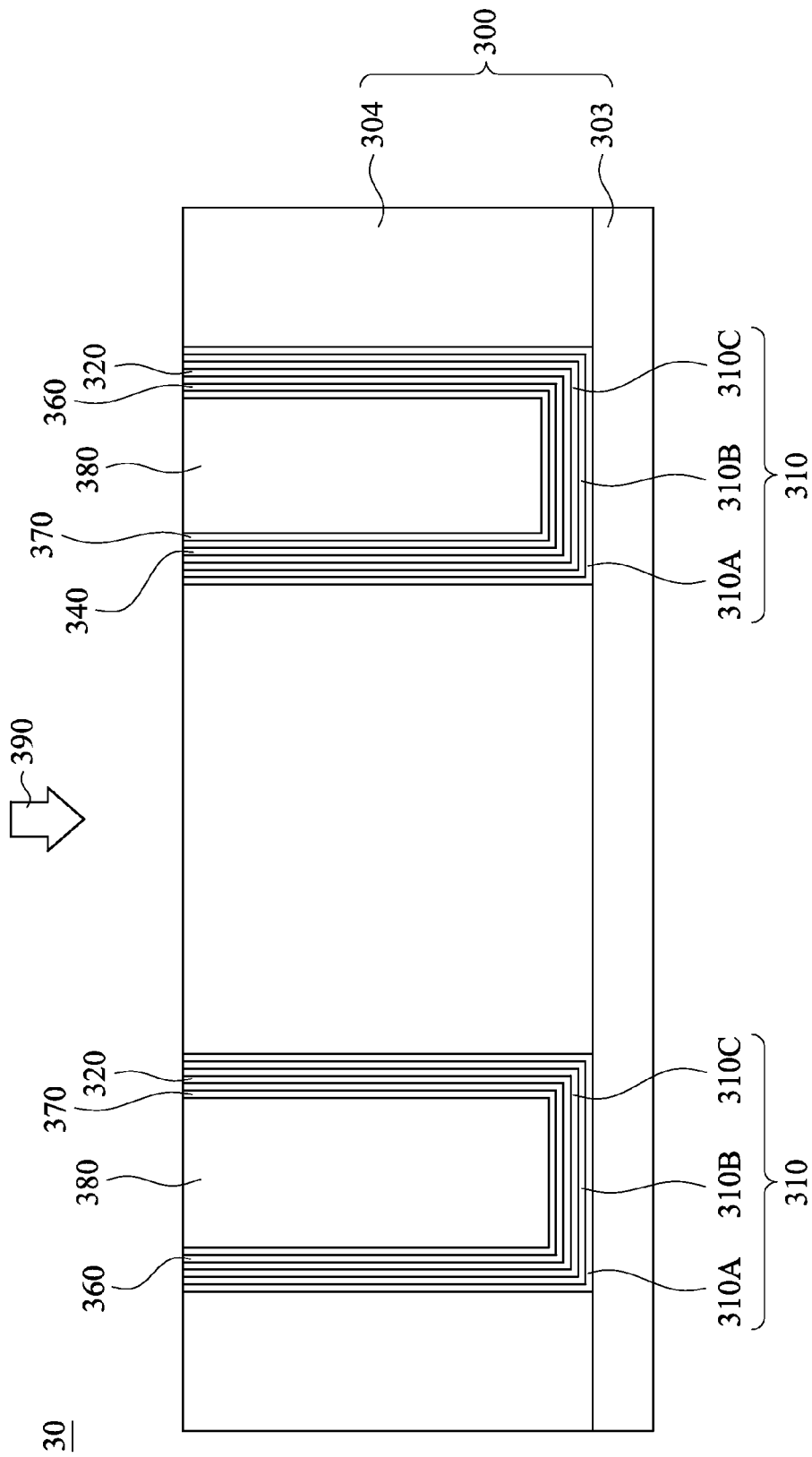

FIG. 3A to FIG. 3S are schematic cross-sectional views of intermediate stages showing a method for fabricating a semiconductor device 30 in accordance with some embodiments of the present disclosure. As shown in FIG. 3A, a substrate 300 is provided. The substrate 300 has a first region 300A and a second region 300B. The substrate 300 includes a first dummy poly gate 302A and a second dummy poly gate 302B, in which the first dummy poly gate 302A and the second dummy poly gate 302B are formed in the first region 300A and the second region 300B respectively. In some embodiments, the substrate 300 may be formed from the material similar to the material forming the substrate 210. In some embodiments, the substrate 300 includes a FIN region 303 and an oxide layer 304 disposed on the FIN region 303, in which the FIN region 303 may be used as a source/drain region and the oxide layer 304 may be used as an isolation region.

As shown in FIG. 3B, the first dummy poly gate 302A and the second dummy poly gate 302B are removed to form a first trench 303A and a second trench 303B. In some embodiments, the first dummy poly gate 302A and the second dummy poly gate 302B can be removed by, for example, a wet etch process, a dry etch process, other removing process, and/or combinations thereof.

As shown in FIG. 3C, a gate dielectric multi-layer 310 is formed on the first region 300A and the second region 300B. In some embodiments, the gate dielectric multi-layer 310 may include an interfacial layer 310A, a high-k dielectric layer 310B and a high-k capping layer 310C. The interfacial layer 310A may include a silicon oxide layer with a thickness ranging from about 5 angstroms to about 10 angstroms. The high-k dielectric layer 310B may be formed on the interfacial layer 310A by using atomic layer deposition (ALD) or other suitable technique. The high-k dielectric layer 310B may have a thickness ranging from about 10 angstroms to about 40 angstroms. The high-k dielectric layer 310B may include hafnium oxide ($HfO_2$). In some embodiments, the high-k dielectric layer 310B may optionally include other high-k dielectrics such as hafnium silicon oxide (HfSiO), hafnium silicon oxynitride (HfSiON), hafnium tantalum oxide (HMO), hafnium titanium oxide (HfTiO), hafnium zirconium oxide (HfZrO), or combinations thereof. The high-k capping layer 310C is formed on the high-k dielectric layer 310B. In some embodiments, the high-k capping layer 310C may be formed from materials including TiN or TaN.

As shown in FIG. 3D, an etch stop layer 320 is formed on the gate dielectric multi-layer 310. In some embodiments, the etch stop layer 320 may be formed from a commonly used material including, but not limited to, SiNx, SiOx, SiON, SiC, SiCN, BN, SiBN, SiCBN, TiN, TaN, or combinations thereof. In alternative embodiments, the etch stop layer 320 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like also can be used.

As shown in FIG. 3E, a sacrificial layer 330 is formed on the etch stop layer 320, in which the sacrificial layer 330 is formed from titanium nitride and has a predetermined crystalline orientation ratio of [200] to [111]. In some embodiments, the sacrificial layer 330 is formed at a temperature in a range from about 300° C. to about 600° C. to have different predetermined crystalline orientation ratios of [200] to [111]. For example, the predetermined crystalline orientation ratio is 0.62 when the sacrificial layer 330 is formed at about 550° C.; or the predetermined crystalline orientation ratio is 0.92 when the sacrificial layer 330 is formed at about 360° C. In certain embodiments, the sacrificial layer 330 has a thickness in a range from about 10 angstroms to about 40 angstroms.

As shown in FIG. 3F to FIG. 3I, a tungsten hexafluoride thermal treatment 340 is performed on the sacrificial layer 330 on the first region 300A, thereby enabling the high-k capping layer 310C on the first region 310A to have a fluorine concentration in a range from about 1 at % to about 10 at %. In some embodiments, a dielectric material 341, e.g. spin-on-glass (SOG), can be formed on the sacrificial layer 330, as shown in FIG. 3F. The dielectric material 341 is patterned to expose the sacrificial layer 330 on the first region 300A, as shown in FIG. 3G. The tungsten hexafluoride thermal treatment 341 on the sacrificial layer 330 on the first region 300A and the dielectric material 341 on the second region 300B, as shown in FIG. 3H. The dielectric material 341 on the second region 300B is removed, as shown in FIG. 3I. In some embodiments, the tungsten hexafluoride thermal treatment 341 is performed at 400° C.~450° C. in a mixed gas including Argon and tungsten hexafluoride which is at a ratio of about 30:1 (Argon: tungsten hexafluoride). In certain embodiments, the mixed gas is provided at a flow rate in a range from about 1000 sccm to about 1500 sccm, in a total pressure in a range from about 30 torr to about 50 torr.

An amount of the fluorine concentration is corresponding to the sacrificial layer 330 with different predetermined crystalline orientation ratios. For example, when the crystalline orientation of the sacrificial layer 330 is [111], the sacrificial layer 330 has a higher atomic factor (than that of the sacrificial layer 330 when the crystalline orientation of the sacrificial layer 330 is [200], therefore the fluorine atomic of the tungsten hexafluoride is difficult to diffuse into the high-k capping layer 310C on the first region 300A. Thus, the sacrificial layer 330 with different predetermined crystalline orientation ratios may used for controlling the fluorine concentration of the high-k capping layer 310C, thereby adjusting a work function of a first-type work function metallic layer (which is formed in the following operation, as shown in FIG. 3K to FIG. 3O.)

As shown in FIG. 3J, the sacrificial layer 330 is removed to expose the etch stop layer 320. In some embodiments, the sacrificial layer 330 can be removed by, for example, a wet etch process, a dry etch process, other removing process, and/or combinations thereof.

As shown in FIG. 3K to FIG. 3O, a first-type work function metallic layer 340 is formed on the etch stop layer 320 on the first region 300A. In some embodiments, the first-type work function metallic layer 340 is formed on the etch stop layer 320, as shown in FIG. 3K. A dielectric material 350, e.g. spin-on-glass (SOG), can be formed on the first-type work function metallic layer 340, as shown in FIG. 3L. The dielectric material 350 is patterned to expose the first-type work function metallic layer 340 on the second region 300B, as shown in FIG. 3M. The first-type work function metallic layer 340 on the second region 300B is removed, as shown in FIG. 3N. The dielectric material on the first region is removed, as shown in FIG. 3O.

In some embodiments, the first-type work function metallic layer 340 may be a p-type work function metallic layer on the etch stop layer 320 on the first region 300A. In certain embodiments, the p-type work function metallic layer may include materials such as metal, metal carbide, metal nitride, other materials that can provide a desired work function for transistors, or the combinations thereof. In some embodiments, the p-type work function metallic layer can include a material such as ruthenium, palladium, platinum, cobalt, nickel, and conductive metal oxides, e.g., ruthenium oxide, other materials that can provide a desired work function for transistors, or the combinations thereof. In other embodiments, the p-type work function metallic layer can include TiN. The p-type work function metallic layer is capable of providing a work function value of about 4.8 eV.

As shown in FIG. 3P, a second-type work function metallic layer 360 is formed on the etch stop layer 320 on the second region 300B and on the first-type work function metallic layer 340. In some embodiments, the second-type work function metallic layer 360 may be a n-type work function metallic layer. The n-type work function metallic layer 223B can include materials such as metal, metal carbide, metal nitride, other materials that can provide a desired work function for transistors, or the combinations thereof. In some embodiments, the n-type work function metallic layer can include materials such as hafnium, zirconium, titanium, tantalum, aluminum, metal carbides, other materials that can provide a desired work function for transistors, or the combinations thereof. In other embodiments, the n-type work function metallic layer can be formed from TiAl. The n-type work function metallic layer may be capable of providing a work function value of about 4.3 eV.

As shown in FIG. 3Q, a barrier layer 370 is formed on the second-type work function metallic layer 360. In some embodiments, the barrier layer 370 may be formed from materials including TaN or TiN. The barrier layer 370 may have a thickness ranging from about 10 angstroms to about 20 angstroms. The barrier layer 370 may be formed by using various deposition techniques such as ALD, PVD, CVD, or other suitable techniques.

As shown in FIG. 3R, a silicide layer 380 is formed on the barrier layer 370. In some embodiments, the silicide layer 380 can be configured to provide an electrical transmission. In some embodiments, the silicide layer 380 may be formed from materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), titanium silicide (TiSi), tungsten, other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may be formed by a one-step RTP or multiple-step RTPs. As shown in FIG. 3S, a chemical mechanical polishing operation 390 is performed on the first region 300A and the second region 300B.

Figure 4:
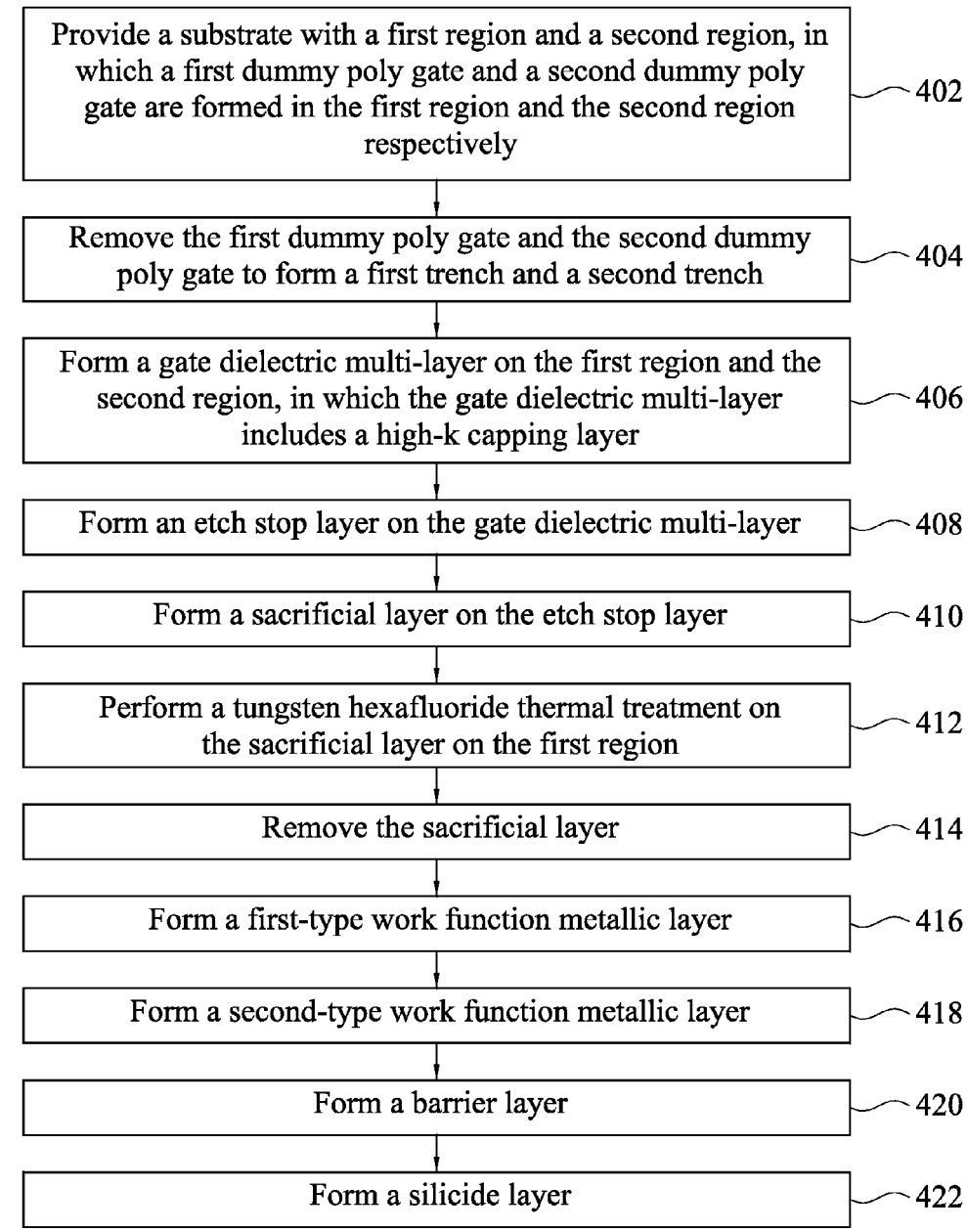
FIG. 4 is a flow chart of a method for fabricating a semiconductor device in accordance with some embodiments of the present disclosure.

Referring to FIG. 4 together with FIG. 3A to FIG. 3H and FIG. 3J to FIG. 3R, FIG. 4 is a flow chart of a method 400 for fabricating a semiconductor device 30 in accordance with some embodiments of the present disclosure. The method 400 begins at operation 402, where a substrate 300 with a first region 300A and a second region 300B is provided, in which a first dummy poly gate 302A and a second dummy poly gate 302B are formed in the first region 300A and the second region 300B respectively, as shown in FIG. 3A. At operation 404, the first dummy poly gate 302A and the second dummy poly gate 302B to form a first trench 303A and a second trench 303B, as shown in FIG. 3B. At operation 406, a gate dielectric multi-layer 310 is formed on the first region 300A and the second region 300B, in which the gate dielectric multi-layer includes a high-k capping layer 310C, as shown in FIG. 3C. At operation 408, an etch stop layer 320 is formed on the gate dielectric multi-layer 310, as shown in FIG. 3D. At operation 410, a sacrificial layer 330 is formed on the etch stop layer, in which the sacrificial layer 330 is formed from titanium nitride and has a predetermined crystalline orientation ratio of [200] to [111], as shown in FIG. 3E. At operation 412, a tungsten hexafluoride thermal treatment is performed on the sacrificial layer on the first region, thereby enabling the high-k capping layer 310C on the first region 300A to have a fluorine concentration substantially in a range from 1 at % to 10 at %, as shown in FIG. 3F to FIG. 3H. At operation 414, the sacrificial layer 330 is removed to expose the etch stop layer 320, as shown in FIG. 3J. At operation 416, a first-type work function metallic layer 340 is formed on the etch stop layer 320 on the first region 300A, as shown in FIG. 3K to FIG. 3O. At operation 418, a second-type work function metallic layer 360 is formed on the etch stop layer 320 on the second region 300B and on the first-type work function metallic layer 350, as shown in FIG. 3P. At operation 420, a barrier layer 370 is formed on the second-type work function metallic layer 360, as shown in FIG. 3Q. At operation 422, a silicide layer 380 is formed on the barrier layer 370, as shown in FIG. 3R.

In accordance with some embodiments, the present disclosure discloses a metal-oxide semiconductor structure. The metal-oxide semiconductor structure includes a substrate, a gate dielectric multi-layer, an etch stop layer, a work function metallic layer, a barrier layer and a silicide layer. The substrate has a trench. The gate dielectric multi-layer overlies the trench, in which the gate dielectric multi-layer includes a high-k capping layer with a fluorine concentration substantially in a range from 1 at % to 10 at %. The etch stop layer is disposed on the gate dielectric multi-layer. The work function metallic layer is disposed on the etch stop layer. The barrier layer is disposed on the work function metallic layer. The silicide layer disposed on the barrier layer.

In accordance with certain embodiments, the present disclosure discloses a semiconductor device. The semiconductor device includes a substrate, a first metal-oxide semiconductor structure and a second metal-oxide semiconductor structure. The substrate has a first trench and a second trench. The first metal-oxide semiconductor structure is disposed on the substrate. The first metal-oxide semiconductor structure includes a first gate dielectric multi-layer, a first etch stop layer, a first work function metallic layer, a first barrier layer and a first silicide layer. The first gate dielectric multi-layer overlies the first trench, in which the first gate dielectric multi-layer includes a first high-k capping layer with a first fluorine concentration substantially in a range from 1 at % to 10 at %. The first etch stop layer is disposed on the first gate dielectric multi-layer. The first work function metallic layer is disposed on the first etch stop layer. The first barrier layer is disposed on the first work function metallic layer. The first silicide layer is disposed on the first barrier layer. The second metal-oxide semiconductor structure is disposed on the substrate and adjacent to the first metal-oxide semiconductor structure. The second metal-oxide semiconductor structure includes a second gate dielectric multi-layer, a second etch stop layer, a second work function metallic layer, a second barrier layer and a second silicide layer. The second gate dielectric multi-layer overlies the second trench. The second etch stop layer is disposed on the second gate dielectric multi-layer. The second work function metallic layer is disposed on the second etch stop layer. The second barrier layer is disposed on the second work function metallic layer. The second silicide layer is disposed on the second barrier layer.

In accordance with alternative embodiments, the present disclosure discloses a method for fabricating a semiconductor device. In this method, a substrate with a first region and a second region is provided, in which a first dummy poly gate and a second dummy poly gate are formed in the first region and the second region respectively. The first dummy poly gate and the second dummy poly gate are removed to form a first trench and a second trench. A gate dielectric multi-layer is formed on the first region and the second region, in which the gate dielectric multi-layer includes a high-k capping layer. An etch stop layer is formed on the gate dielectric multi-layer. A sacrificial layer is formed on the etch stop layer, in which the sacrificial layer is formed from titanium nitride and has a predetermined crystalline orientation ratio of [200] to [111]. A tungsten hexafluoride thermal treatment is performed on the sacrificial layer on the first region, thereby enabling the high-k capping layer on the first region to have a fluorine concentration substantially in a range from 1 at % to 10 at %. The sacrificial layer is removed to expose the etch stop layer. A first-type work function metallic layer is formed on the etch stop layer on the first region. A second-type work function metallic layer is formed on the etch stop layer on the second region and on the first-type work function metallic layer. A barrier layer is formed on the second-type work function metallic layer. A silicide layer is formed on the barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    providing a substrate with a first region and a second region, wherein a first dummy poly gate and a second dummy poly gate are formed in the first region and the second region respectively;
    removing the first dummy poly gate and the second dummy poly gate to form a first trench and a second trench;
    forming a gate dielectric multi-layer on the first region and the second region, wherein the gate dielectric multi-layer includes a high-k capping layer;
    forming an etch stop layer on the gate dielectric multi-layer;
    forming a sacrificial layer on the etch stop layer, wherein the sacrificial layer is formed from titanium nitride and has a predetermined crystalline orientation ratio of [200] to [111];
    performing a thermal treatment using tungsten hexafluoride on the sacrificial layer on the first region, thereby enabling the high-k capping layer on the first region to have a fluorine concentration substantially in a range from 1 at % to 10 at %;
    removing the sacrificial layer to expose the etch stop layer;
    forming a first-type work function metallic layer on the etch stop layer on the first region;
    forming a second-type work function metallic layer on the etch stop layer on the second region and on the first-type work function metallic layer;
    forming a barrier layer on the second-type work function metallic layer; and
    forming a silicide layer on the barrier layer.

2. The method of claim 1, wherein after forming the silicide layer on the barrier layer, the method further comprises performing a chemical mechanical polishing operation on the first region and the second region.

3. The method of claim 1, wherein performing the thermal treatment on the sacrificial layer on the first region further comprises:
    forming a dielectric material on the sacrificial layer;
    patterning the dielectric material to expose the sacrificial layer on the first region;
    performing the tungsten hexafluoride thermal treatment on the sacrificial layer on the first region and the dielectric material on the second region; and
    removing the dielectric material on the second region.

4. The method of claim 1, wherein forming the first-type work function metallic layer on the etch stop layer on the first region further comprises:
    forming the first-type work function metallic layer on the etch stop layer;
    forming a dielectric material on the first-type work function metallic layer;
    patterning the dielectric material to expose the first-type work function metallic layer on the second region;
    removing the first-type work function metallic layer on the second region; and
    removing the dielectric material on the first region.

5. The method of claim 1, wherein forming the gate dielectric multi-layer comprises:
    forming an interfacial layer on the first region and the second region;
    forming a high-k dielectric layer on the interfacial layer; and
    forming the high-k capping layer on the high-k dielectric layer.

6. The method of claim 1, wherein forming the first-type work function metallic layer on the etch stop layer on the first region further comprises forming a p-type work function metallic layer on the etch stop layer on the first region.

7. The method of claim 1, wherein forming the second-type work function metallic layer on the etch stop layer on the second region and on the first-type work function metallic layer further comprises forming a n-type work function metallic layer on the etch stop layer on the second region and on the first-type work function metallic layer.

8. The method of claim 1, wherein performing the tungsten hexafluoride thermal treatment further comprises performing the tungsten hexafluoride thermal treatment with a process temperature substantially in a range from 400° C. to 450° C.

9. The method of claim 1, wherein forming the sacrificial layer on the etch stop layer further comprises forming the sacrificial layer having the predetermined crystalline orientation ratio of to [111] substantially in a range from 0.66 to 0.92.

10. A method for fabricating a semiconductor device, comprising:
    providing a substrate with a first region and a second region;
    forming a first trench and a second trench in the first region and the second region respectively;
    forming a gate dielectric multi-layer on the first region and the second region, wherein the gate dielectric multi-layer comprises a high-k capping layer;
    forming an etch stop layer on the gate dielectric multi-layer;
    forming a sacrificial layer on the etch stop layer, wherein the sacrificial layer is formed to have a predetermined crystalline orientation ratio of [200] to [111];
    performing a thermal treatment using tungsten hexafluoride on the sacrificial layer on the first region, thereby enabling the high-k capping layer on the first region to have a fluorine concentration substantially in a range from 1 at % to 10 at %;
    removing the sacrificial layer to expose the etch stop layer;
    forming a first-type work function metallic layer on the etch stop layer on the first region;
    forming a second-type work function metallic layer on the etch stop layer on the second region and on the first-type work function metallic layer;
    forming a barrier layer on the second-type work function metallic layer; and
    forming a silicide layer on the barrier layer.

11. The method of claim 10, wherein forming the gate dielectric multi-layer comprises:
   forming an interfacial layer on the first region and the second region;
   forming a high-k dielectric layer on the interfacial layer; and
   forming the high-k capping layer on the high-k dielectric layer.

12. The method of claim 10, wherein forming the sacrificial layer further comprises forming the sacrificial layer from titanium nitride.

13. The method of claim 10, wherein forming the sacrificial layer on the etch stop layer further comprises forming the sacrificial layer having the predetermined crystalline orientation ratio of [200] to substantially in a range from 0.66 to 0.92.

14. The method of claim 10, wherein performing the thermal treatment on the sacrificial layer on the first region further comprises:
   forming a dielectric material on the sacrificial layer on the second region;
   performing the tungsten hexafluoride thermal treatment on the sacrificial layer on the first region and the dielectric material on the second region; and
   removing the dielectric material on the second region.

15. The method of claim 10, wherein performing the tungsten hexafluoride thermal treatment further comprises performing the tungsten hexafluoride thermal treatment with a process temperature substantially in a range from 400° C. to 450° C.

16. The method of claim 10, wherein forming the first-type work function metallic layer on the etch stop layer on the first region further comprises:
   forming the first-type work function metallic layer on the etch stop layer;
   forming a dielectric material on the first-type work function metallic layer on the first region;
   removing the first-type work function metallic layer on the second region; and
   removing the dielectric material on the first region.

17. The method of claim 10, wherein forming the first-type work function metallic layer on the etch stop layer on the first region further comprises forming a p-type work function metallic layer on the etch stop layer on the first region.

18. The method of claim 10, wherein forming the second-type work function metallic layer on the etch stop layer on the second region and on the first-type work function metallic layer further comprises forming a n-type work function metallic layer on the etch stop layer on the second region and on the first-type work function metallic layer.

19. The method of claim 10, wherein after forming the silicide layer on the barrier layer, the method further comprises performing a chemical mechanical polishing operation on the first region and the second region.

20. The method of claim 10, wherein forming the sacrificial layer further comprises forming the sacrificial layer at a temperature substantially in a range from 300° C. to 600° C.

* * * * *